(12) United States Patent
Baiko et al.

(10) Patent No.: US 8,022,349 B2
(45) Date of Patent: Sep. 20, 2011

(54) LINEAR SENSOR ARRAY FOR AN OPTICAL SPECTROSCOPY DEVICE AND METHODS OF USE THEREOF

(75) Inventors: Denis Baiko, Fairport, NY (US); Suraj Bhaskaran, Mendon, NY (US); Judd Jenne, Baldwinsville, NY (US); Mark Hamilton, Upton, MA (US); George Lungu, Colorado Springs, CO (US); Bruce Pirger, Berkshire, NY (US); John Swab, Webster, NY (US); Steven VanGorden, Waterloo, NY (US); Herbert Ziegler, Baldwinsville, NY (US); Michael Pilon, Littleton, MA (US)

(73) Assignee: Thermo Niton Analyzers LLC, Billerica, MA (US)

( * ) Notice: Subject to any disclaimer, the term of this patent is extended or adjusted under 35 U.S.C. 154(b) by 227 days.

(21) Appl. No.: 12/035,477

(22) Filed: Feb. 22, 2008

(65) Prior Publication Data

US 2009/0050786 A1 Feb. 26, 2009

Related U.S. Application Data

(60) Provisional application No. 60/891,320, filed on Feb. 23, 2007.

(51) Int. Cl.
*H01L 27/00* (2006.01)
*H01J 40/14* (2006.01)

(52) U.S. Cl. .................. 250/208.1; 250/214 R

(58) Field of Classification Search ............... 250/208.1, 250/214.1, 214 R, 226; 257/213–215, 222, 257/225, 226; 348/302, 306, 311, 313; 356/213, 356/218, 221, 222, 224
See application file for complete search history.

(56) References Cited

U.S. PATENT DOCUMENTS

| 4,734,776 | A | | 3/1988 | Wang et al. |
| 4,945,420 | A | * | 7/1990 | Berger et al. .................. 348/302 |
| 5,717,199 | A | | 2/1998 | Carbone et al. |
| 6,452,634 | B1 | * | 9/2002 | Ishigami et al. .............. 348/322 |
| 6,628,383 | B1 | | 9/2003 | Hilliard |
| 6,787,749 | B1 | | 9/2004 | Zhou et al. |

(Continued)

FOREIGN PATENT DOCUMENTS

DE 199 00 308 A1 7/2000

OTHER PUBLICATIONS

Bhaskaran et al., "SpectraCAM SPM-A Camera System with High Dynamic Range for scientific and Medical Applications," SPIE Proceedings, pp. 1-9, (2005).

(Continued)

*Primary Examiner* — Que T Le
*Assistant Examiner* — Pascal M Bui Pho
(74) *Attorney, Agent, or Firm* — Sunstein Kann Murphy & Timbers LLP; Charles B. Katz; Gordon Stewart

(57) ABSTRACT

Time-resolved analysis of a spectrum is performed by illuminating a one-dimensional array of charge-transfer device light-sensitive pixel cells and periodically non-destructively copying charges in the light-sensitive cells to respective storage cells ("row storage registers") co-located with the light-sensitive cells in an integrated circuit. Information about the charges stored in at least some of the storage cells is provided to a component external to the integrated circuit.

34 Claims, 17 Drawing Sheets

U.S. PATENT DOCUMENTS

| | | | |
|---|---|---|---|
| 6,801,595 | B2 | 10/2004 | Grodzins et al. |
| 7,336,989 | B2 | 2/2008 | Chuck et al. |
| 7,750,962 | B2* | 7/2010 | Anthony ............... 348/311 |
| 2001/0001487 | A1* | 5/2001 | Mutoh et al. ........... 257/215 |
| 2006/0082772 | A1* | 4/2006 | Kehoe et al. ........... 356/328 |

OTHER PUBLICATIONS

Fowler et al., "An Ultra Low Noise High Speed CMOS Linescan Sensor for Scientific and Industrial Applications," SPIE Proceedings, pp. 1-11, (2004).

Pain et al.., "CMOS Image Sensors Capable of Time Delayed Integration," NASA Tech. Briefs, pp. 47-49, (2001).

True et al., "On the Implementation of Multielement Continuum Source Graphite Furnace Atomic Absorption Spectrometry Utilizing an Echelle/CID Detection System," Applied Spectroscopy, vol. 53 (No. 9), pp. 1102-1110, (1999).

Baird et al.., "Compact, Self-Contained Optical Spectrometer," Applied Spectroscopy, pp. 1699-1704, (1995).

METOREX, "ARC-MET 8000 Mobile Lab," product brochure, pp. 1-4, (2004).

J. Allington-Smith, "Spectroscopy Principles," Presentation, University of Durham, pp. 1-40.

Spectro, "Spectro iSort—The New Arc for Metal Analysis; Simpler, Safer, Faster . . . ," product brochure, http://www.spectro.cz/download/spectro_isort_brozura_en.pdf, pp. 1-4.

RTP Company, "End-Use Cast Study—LCD Projector," http://www.rtpcompany.com/info/apps/stories/lcd.htm, pp. 1-2.

RTP Company, "Case Studies: PPS Applications," http://www.rtpcompany.com/info/apps/resin/pps/index.htm, p. 1.

TCR Engineering Services, "Positive Material Identification (PMI)," brochure, http://www.tcreng.com/services/positive-material-identification-pmi.shtml, pp. 1-2.

* cited by examiner

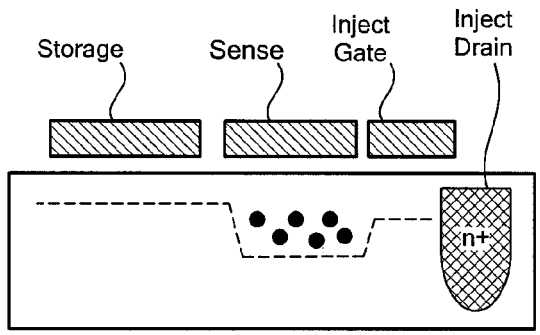
FIG. 4B(1)
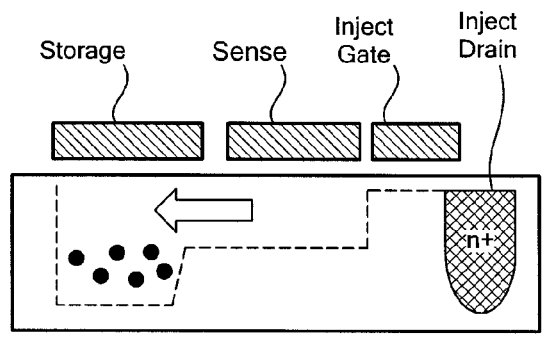
FIG. 4B(2)
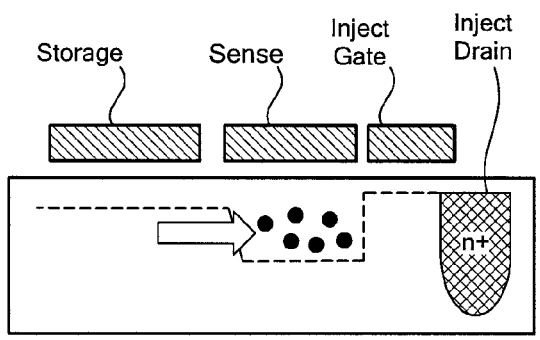
FIG. 4C(1)
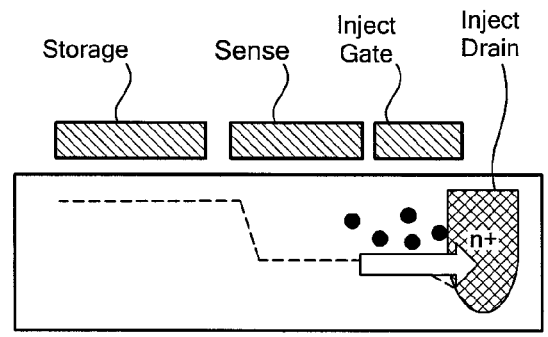
FIG. 4C(2)

LINEAR SENSOR ARRAY FOR AN OPTICAL SPECTROSCOPY DEVICE AND METHODS OF USE THEREOF

The present application claims priority from U.S. Provisional Application Ser. No. 60/891,320, filed Feb. 23, 2007, which is incorporated herein, in its entirety, by reference. It contains subject matter related to that of U.S. patent application of Goulter et al., Ser. No. 12/036,039, contemporaneously filed on Feb. 22, 2008, and incorporated herein by reference.

TECHNICAL FIELD

The present invention relates to time-resolved spectroscopy and the acquisition and analysis of spectra that are time-delayed with respect to an initiating event, and, more particularly, to such spectroscopy using a linear sensor array.

BACKGROUND ART

Analysis of a spectrum produced by an excited sample of material can yield information about the elemental composition of the sample, including relative concentrations of constituent elements. Such analyses are performed in many contexts, including identifying and segregating metal types in metal recycling facilities, and quality control testing in factories and forensic work. In some spectrometric systems, direct reading photomultiplier tube (PMT) systems use multiple PMTs installed at the wavelengths of analytical interest, often covering only a small fraction of the spectrum (typically, less than a few percent of the spectrum from 130 nm to 500 nm).

In some contexts, time-resolution of a spectrum or analysis of a temporal sequent of the spectrum can provide additional or more accurate information about the composition of the sample than would otherwise be obtained.

Conventional two-dimensional charge-coupled devices (CCDs) are sometimes used to capture time-resolved spectral data, subject, however, to limitations of time resolution that preclude utility in certain applications. Such a CCD device includes light-sensitive pixels arranged in rows and columns. In one mode of operation, all but one row of pixels may be masked, so only the one unmasked row is exposed to light. A spectrum is projected on the exposed row of CCD pixels, such that each pixel is exposed to a different portion of the spectrum. Photogenerated charges accumulate under one or more of the exposed pixels. Periodically, the charges stored in all the rows are moved (shifted) to respective adjacent rows. That is, charges in the exposed pixels are moved to the first masked row, charges in the first masked row are moved to the second masked row, etc. Moving the charges out of the exposed row clears the charges from the pixels in that row. Charges in the last row are read out of the device. This architecture yields relatively poor signal-to-noise characteristics and does not facilitate rapid cycling of an imaging device, because charges accumulated in any exposed pixel must move through all the pixels of the corresponding column before the charges can be read out.

SUMMARY OF THE INVENTION

In accordance with preferred embodiments of the present invention, a method is provided for analyzing light with time resolution. The method has steps of:

(a) illuminating a one-dimensional array of charge-transfer device light-sensitive pixel cells with the spectrum, such that each light-sensitive cell is illuminated by a different portion of the spectrum, thereby creating electric charges in one set of the light-sensitive cells;

(b) non-destructively copying the charges in the light-sensitive cells to a first set of respective storage cells co-located with the light-sensitive cells in an integrated circuit;

(c) periodically repeating the preceding step with respect to a different set of storage cells in the integrated circuit; and (d) providing information about the charges stored in at least some of the storage cells to a component external to the integrated circuit.

In accordance with alternate embodiments of the invention, the method may include a further step of allowing electric charges to accumulate in the light-sensitive cells for at least some of the repetitions of the step of non-destructively copying charges. Moreover, the method may have an additional step of clearing the electric charges in a subset of the light-sensitive cells, and yet an additional step of specifying the subset of light-sensitive cells from which electric charge is to be cleared.

The method may further entail providing at least 2,000 light-sensitive cells on the integrated circuit, and at least 16 storage cells per pixel cell. In some embodiments of the invention, the information about stored charges is, itself, stored in a memory that is external to the integrated circuit. The information about stored charges may relate to all, or to a subset, of the storage cells, and information identifying selected storage cells may be received from an external component.

The method may also include a step of analyzing the provided information about the stored charges to identify at least one elemental constituent of a sample used to produce the spectrum.

In accordance with other embodiments of the invention, a method is provided that has steps of:

illuminating a one-dimensional array of charge-transfer device light-sensitive pixel cells with the spectrum, such that each light-sensitive pixel cell is illuminated by a different portion of the spectrum, thereby creating electric charges in ones of the light-sensitive cells;

periodically non-destructively copying the charges in the light-sensitive cells to respective storage cells co-located with the pixel cells on an integrated circuit; and if charges in at least one of the storage cells exceed a predetermined value, storing information about the charges in a memory.

In some embodiments of the invention, the memory may be co-located with the pixel cells on the integrated circuit. The method may include further steps of clearing charges in at least one light-sensitive pixel cell corresponding to the at least one storage cell, and, if an exposure time exceeds a predetermined value, storing information about the charges in a memory. In particular, charge may be cleared in at least one light-sensitive pixel cell corresponding to the at least one storage cell. Moreover, the method may also include a step of summing, on a per-pixel basis, the information stored in the memory.

In further embodiments of the invention, if a predetermined amount of time passes, information is stored about charges in at least one of the storage cells in a memory without clearing charges in any corresponding light-sensitive pixel cell.

In yet another embodiment of the invention, the number of charge-transfer device light-sensitive pixel cells exceeds a specified number of exposed charge-transfer device light-sensitive pixel cells in such a manner as to allow for dynamically variable registration of wavelength to pixel number.

In accordance with another aspect of the present invention, an integrated circuit is provided that has an array of charge-transfer device light-sensitive pixel cells. Additionally, the integrated circuit has a plurality of sets of charge storage cells, wherein, for each set of the storage cells, each storage cell of the set is coupled to a different one of the light-sensitive pixel cells for copying a charge from the light-sensitive pixel cell to the storage cell. Finally, the integrated circuit has a first control logic operative to periodically non-destructively copy photogenerated charges from the pixel cells to a successive set of the storage cells, and a second control logic operative to provide information about the charges stored in at least one of the storage cells to a component external to the integrated circuit.

In accordance with other embodiments of the invention, the integrated circuit may also have a plurality of preamplifiers, a preamplifier associated with each light-sensitive pixel cell. The array of light-sensitive pixel cells may be one- or two-dimensional, and may, in particular, have at least 2,000 pixels arranged in a one-dimensional array. There may be at least 16 sets of charge storage cells per light-sensitive pixels cell. The second control logic may be operative to provide the information about the charges stored in fewer than all of the storage cells to the component external to the integrated circuit, and the information about the charges stored in the storage cells may be randomly addressable by a component external to the integrated circuit.

There may be provided, in certain embodiments, a third control logic, operative to receive information identifying fewer than all of the pixel cells and to clear the photogenerated charges stored in the identified pixel cells. The second control logic may be operative to provide the information about the charges stored in the at least one of the storage cells to the external component as either an analog signal or a digital signal.

In accordance with other embodiments of the invention, the integrated circuit may also have a plurality of preamplifiers, a preamplifier associated with each light-sensitive pixel cell. In accordance with another aspect of the present invention, a computer-based graphical user interface is provided that may be used to define one or more regions of interest on a two-dimensional manifold defined by wavelength and time following a fiducial event. The interface has a menu depicting wavelengths of interest, temporal gating start times and temporal gating durations for receiving user input. The interface also has a region of interest module for compiling user-specified wavelengths of interest, gating start times and temporal gating durations into user specified regions of interest, and a software module for grouping the user specified regions of interest into a circular ROI queue. Finally, the interface has an executive module for performing pixel interrogation and data storage functions in accordance with the user specified regions of interest, and the executive module may also include a comparator for determining whether a user specified region of interest contains a signal exceeding a specified maximum pixel signal.

Other aspects of the present invention provide a method for extending a dynamic range of an imaging system for associating one or more scalar values with ordered elements of a space. {in any number of dimensions}, the scalar values characterizing a signal response to an excitation, the ordered elements of the space including at least one region of interest defined as a subset of the ordered elements of the space, each region of interest characterized by a threshold time, the method comprising:

exposing the imaging system to the excitation for a first pre-exposure time to determine the threshold time for all regions of interest whose threshold time exceeds a specified duration;

exposing the imaging system to the excitation for a second pre-exposure time shorter than the first pre-exposure time to determine the threshold times for regions of interest whose threshold time is shorter than the specified duration;

on the basis of the determined threshold times, reading and resetting values of ordered elements of the space in accordance with corresponding regions of interest.

In a particular embodiment of the invention, the step of exposing the imaging system to the excitation for a second pre-exposure time precedes the step of exposing the imaging system to the excitation for a first pre-exposure time.

BRIEF DESCRIPTION OF THE DRAWINGS

The invention will be more fully understood by referring to the following Detailed Description of Specific Embodiments in conjunction with the Drawings, of which:

FIG. 4B(1) depicts a potential well diagram for Linear CID pixel readout, where, in a first sequence, charge is transferred to the Sense photogate, while, in FIG. 4B(2), charge is transferred from the Sense to the Storage photogate;

FIG. 4C(1) depicts a potential well diagram for the injection (or clearing) of charge from a Linear CID pixel site, with the charge first transferred to the storage photogate, while FIG. 4C(2) shows the charge cleared from the Storage and Sense photogates;

DETAILED DESCRIPTION OF SPECIFIC EMBODIMENTS

In accordance with preferred embodiments of the present invention, methods and apparatus are disclosed for analyzing spectra with time resolution, or with time integration, using a one-dimensional array of charge-transfer device light-sensitive pixels (also referred to as "linear sensor array"). The light-sensitive pixels may be charge-coupled devices (CCD), charge-injection devices (CID), or another suitable type of charge-transfer device or a combination of types. The disclosed methods and apparatus are applicable in many contexts, including hand-held chemical composition analyzers, such as analyzers employing optical emission spectroscopy (OES), optical absorption spectroscopy, optical fluorescence spectroscopy and astronomy.

Figure 1:
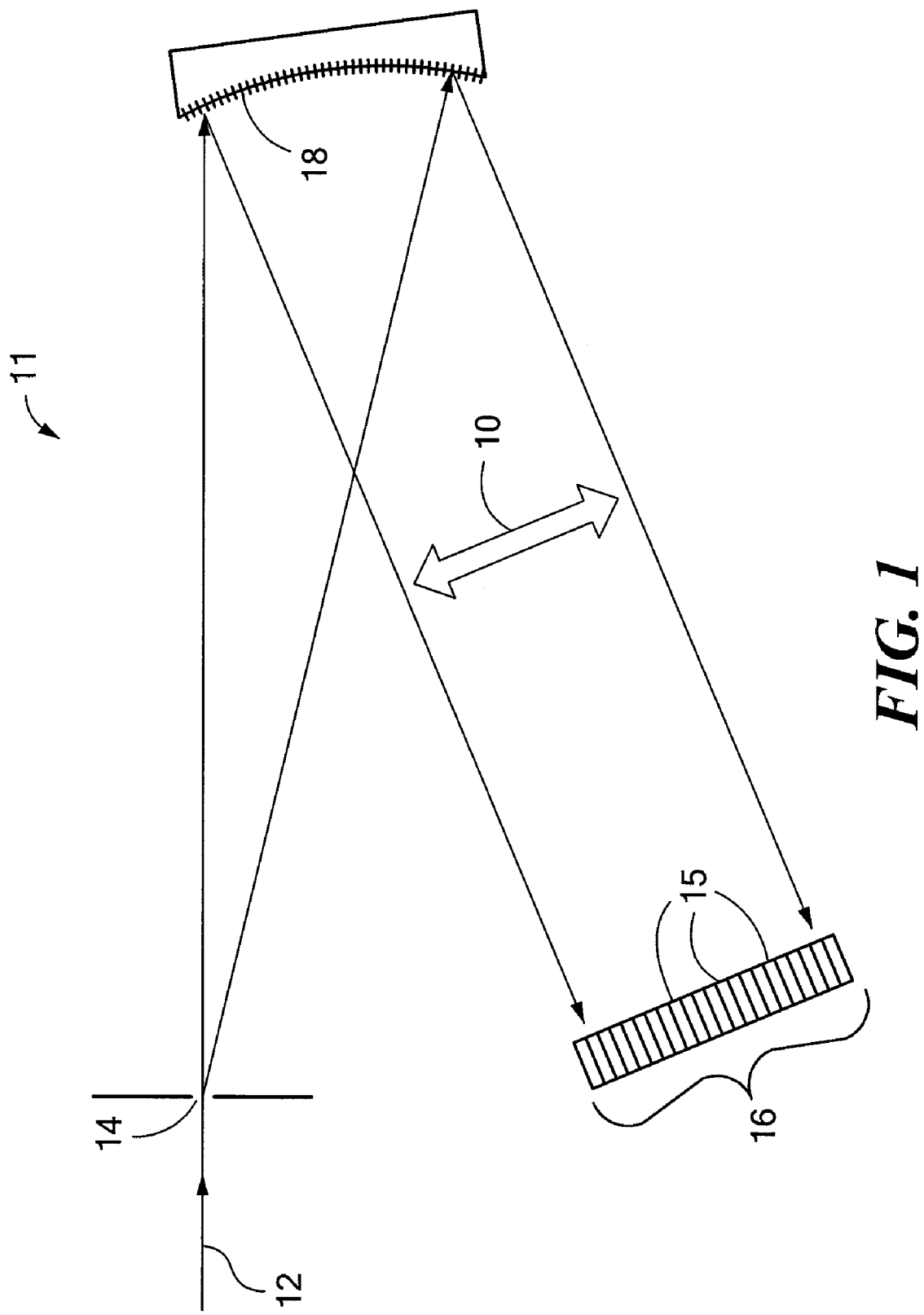
FIG. 1 is a schematic diagram of an exemplary environment in which the IC of FIG. 2 may be used, according to one embodiment of the present invention.

In one context, illustrated schematically in FIG. 1, a spectrum 10 produced by exciting a portion of a sample (such as by a spark/arc, laser, etc.) or otherwise, such as by absorption of the light of a reference source, is projected on the linear sensor array via a diffraction grating 18, such that each pixel 15 is illuminated by a different portion (i.e., a different wavelength or range of wavelengths) of the spectrum, as shown schematically in FIG. 1. Light 12 from the sample enters the spectrometer, designated generally by numeral 11, via entrance slit 14. The illumination creates photogenerated charges in one or more of the light-sensitive pixels.

The following sections provide: (1) the electronic architecture of one embodiment of the linear sensor array, (2) the architecture of an electronic control system driving the linear sensor array, and (3) descriptions of algorithms that may be employed to yield the time integration or time resolved data for certain chemical composition analysis applications to which the linear sensor array and control system can be applied.

Linear Sensor Array

Figure 2:
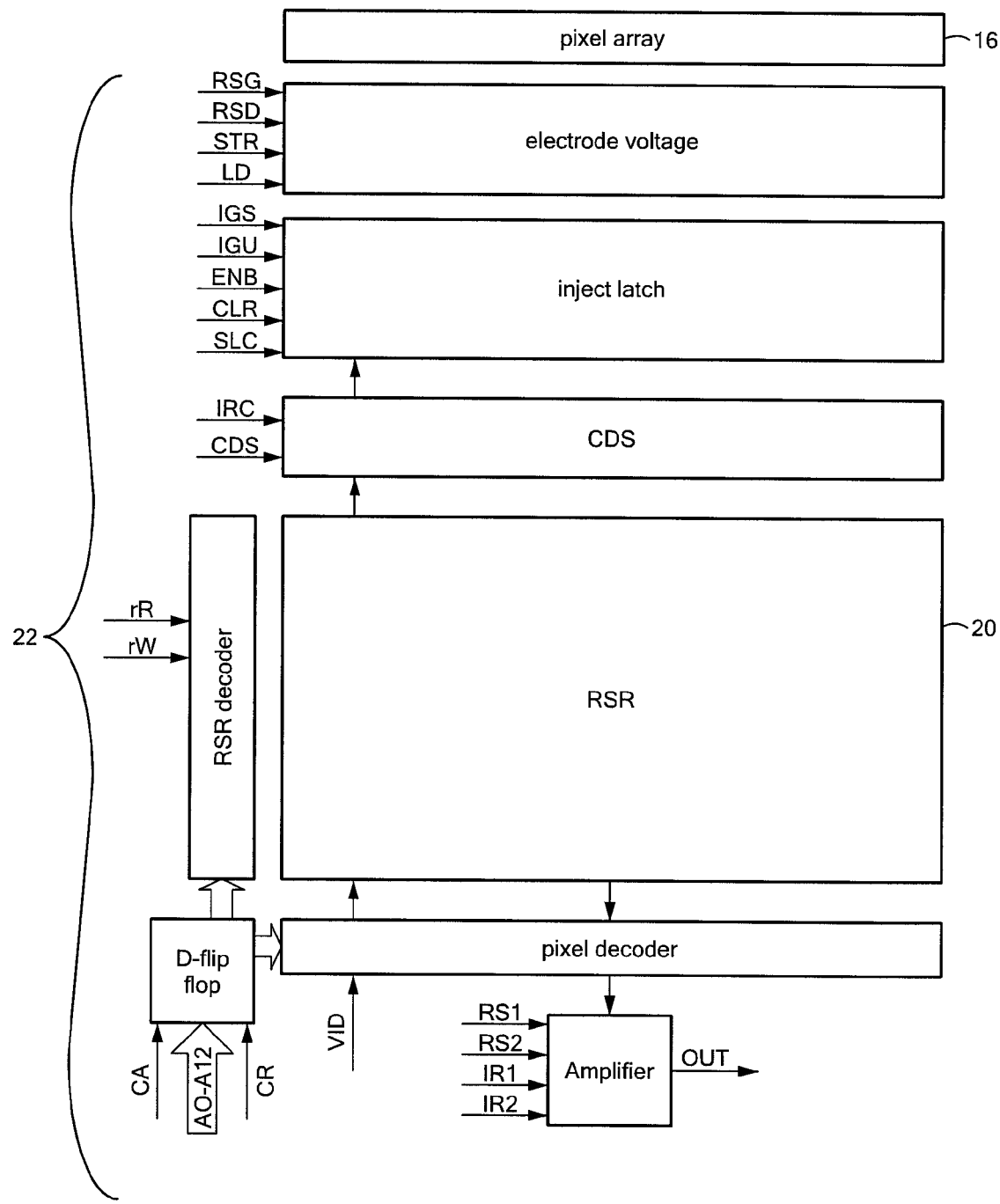
FIG. 2 is a block diagram of an integrated circuit (IC) having a one-dimensional array of charge-transfer device light-sensitive pixels, according to one embodiment of the present invention.

In one embodiment, an integrated circuit (IC) includes a one-dimensional array of light-sensitive pixels 16, a plurality of rows of charge storage cells (also referred to as "row storage registers" (RSRs)) and control logic 22, as shown schematically in FIG. 2.

Figure 3B:
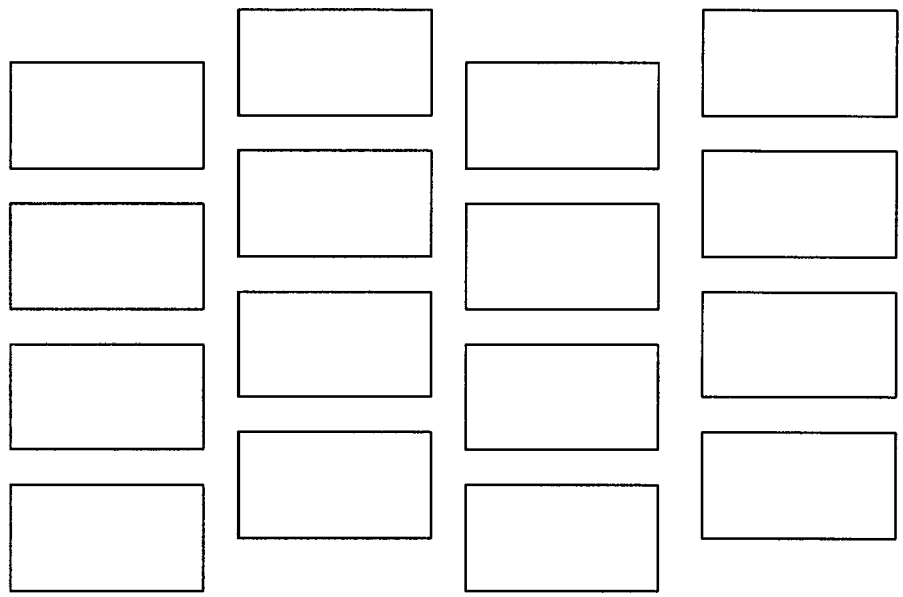
FIGS. 3A and 3B depict two embodiments of staggered pixel structures for Linear CIDs to increase effective spectral resolution in accordance with embodiments of the present invention.
Figure 3A:
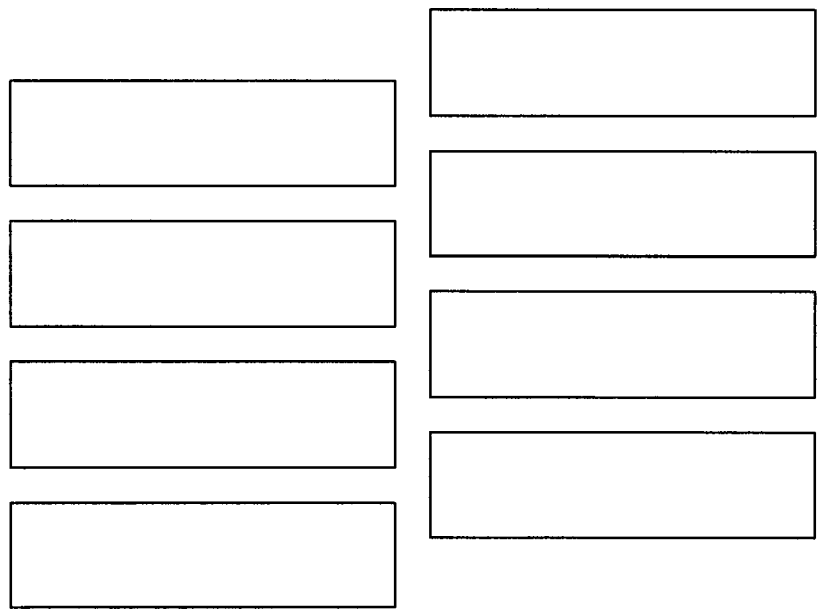

The one-dimensional array of light-sensitive pixels 16 may be arranged in a single row, or the pixels may be staggered across two or more rows, as shown schematically in FIGS. 3A and 3B. Staggering the light-sensitive pixels provides a smaller effective pixel pitch, and higher effective spatial resolution. In one embodiment (FIG. 3A), the light-sensitive pixels are 14 μm-wide pixels evenly staggered in two rows. The resulting effective pitch is 7 μm, and the full well capacity is approximately 300,000 electrons. The pixel height is 100 μm and can be optimized to match the height of the imaged entrance slit. Thus, as used herein, the terms "one-dimensional" and "linear array" indicate that no more than a single value, representing spectral content, is associated with the intensity of the dispersed beam at any displacement, even though that value may be derived from detectors which are, themselves, centered above or below a particular line.

Pixel Operation

Figure 4A:
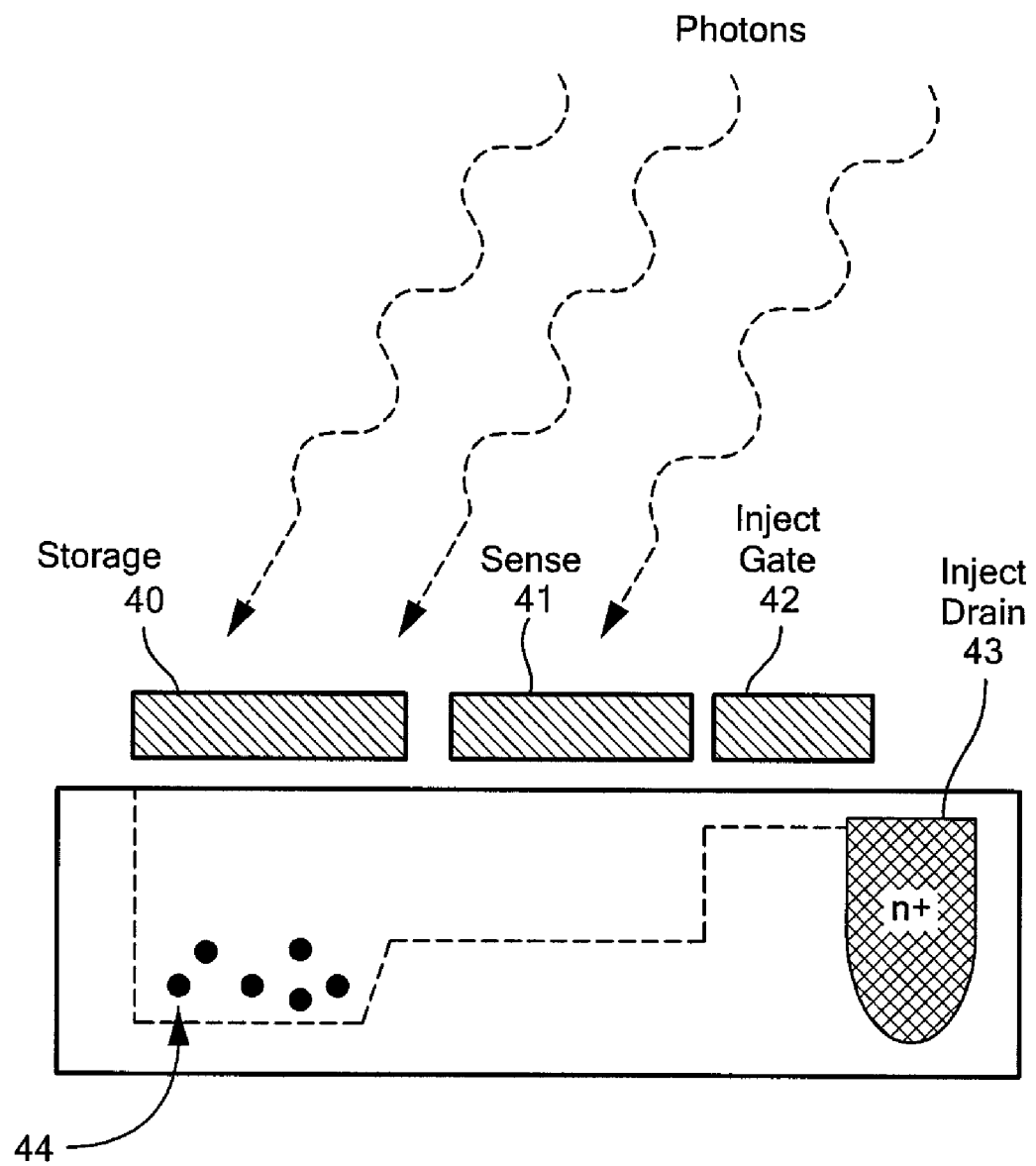
FIG. 4A depicts a potential well diagram for photogenerated charge integration in a Linear CID pixel.

As depicted in FIGS. 4A-4C, the light sensitive pixels of an embodiment referred to as a linear CID contain two photogates employed for pixel readout (the 'Storage' 40 and 'Sense' 41 photogates) along with an 'Inject Gate' 42 and an 'Inject Drain' 43. The Sense photogate is electrically connected to a source-follower and a reset circuit. The Inject Gate is provided to control the skimming and injection of photogenerated charge from the pixel. The Inject Drain serves as a sink for the removal of the photogenerated charge.

The linear sensor array may incorporate a preamplifier on each pixel (preamplifier-per-pixel or active pixel) such as the source-follower combined with photogate employed in the Linear CID described above. Two-dimensional preamplifier-per-pixel or active pixel CCD or CMOS devices may also be employed.

Pixel injection, as depicted in FIG. 4C, can be performed after pixel readout or at any time in the exposure cycle when a clearing of photogenerated charge is required. During the inject cycle, the Sense and the Storage photogates are biased to 'Vsto_inj' and 'Vsen_inj,' respectively, and the Inject Drain voltage is set to 'Vdrain$_{13}$ inj'. The Inject Gate is then biased to inject potential 'V_in'. The injection can be performed globally (on all pixels simultaneously), on groups of pixels (also referred to as 'segment inject'), or on a pixel-by-pixel basis. The charges in any light-sensitive pixel or (contiguous or discontiguous) group of light-sensitive pixels may be cleared independently of the remaining light-sensitive pixels. The light-sensitive pixels may be randomly addressed for clearing.

Photon generated charge integration, as depicted in FIG. 4A, occurs when positive voltages are applied to the Sense 41 and Storage 40 electrodes. The integration time is the amount of time that these two photogates remain in deep-depletion bias. ("Deep-depletion" refers to the non-equilibrium condition in which a relatively deep region depleted of mobile charge is formed under the gate electrode of a MOS device due to the voltage applied to that gate electrode.) As photons of sufficient energy to promote an electron into the conduction band strike the pixel, the resulting mobile charge is drawn to the potential well created by the Storage electrode bias.

The total amount of photon-generated charge 44 that is collected at the Storage electrode is a function of the light intensity, the duration of the integration, and the charge contribution from dark current. While the dark current can be reduced by optimizing the imager design and the fabrication process, it cannot be completely eliminated. Therefore, for applications requiring extended integration times, the linear sensor array is cooled.

Pixel readout, as depicted in FIG. 4B, is executed first by a forward transfer of the photon-generated charge from the Storage to the Sense photogate, followed by a back transfer of the charge from the Sense to the Storage photogate. During forward transfer, the Sense gate is referenced to the 'Vsen_read' potential, while the Storage gate is referenced to the 'Vsto_tfr' potential. The Sense gate is then floated and the first potential sampling of the Sense gate, CDS1, is obtained. CDS1 measures the sum of the photogenerated charge and the noise signature of the pixel.

The Storage gate is then referenced to 'Vsto_btfr' which transfers charge from the Sense gate back to the Storage gate. The Sense gate continues to float during this operation. The second Sense photogate sample, CDS2, is then obtained. The CDS2 signal represents the noise signature of the pixel only. The noise-corrected signal of interest is then the difference between the values stored on the two CDS capacitors (CDS1 minus CDS2). This value (CDS1 minus CDS2) is proportional to the amount of charge at the pixel site. The pixel readout process is non-destructive to the photogenerated charge at the pixel site. It is possible to non-destructively interrogate (read) the photon-generated charge level of any pixel on the Linear CID. Non-destructive pixel readout improves dynamic range and time resolved performance for spark OES and other applications.

It is possible to randomly access any pixel position on the Linear CID device. The pixels are addressable in any random order and in either direction. It is possible to either interrogate (read) or clear the photon-generated charge in any randomly addressed pixel. Pixel random accessibility improves dynamic range and time resolved performance for spark OES and other applications.

Row Storage Registers (RSR)

The linear sensor array includes separate per-pixel capacitors (referred to as row storage registers (RSR)) 20 (in FIG. 2) for storing the pixel signal at various times. The light-sensitive pixels on the linear sensor array are coupled via a switching network to the RSRs. In various embodiments, 8 or 32 or any other number of RSRs per pixel may be implemented in the device, with various advantages accruing to differing numbers of RSRs in differing applications. The per-pixel capacitors may be of a MIM-type (metal-insulator-metal), MOS-type (metal oxide semiconductor) or other suitable type.

Under the control of the control logic (rW, IRC and CDS in FIG. 2); photogenerated charges in all the light-sensitive pixels may be non-destructively copied in parallel via correlated double sampling (CDS), as known in the art, to corresponding storage cells in any row of the RSRs. Thus, the RSRs are effectively randomly accessible analog memory devices.

Unlike the operation of typical CCD devices, charges, in a CID array, are not moved from light-sensitive pixels to other cells, indeed, in accordance with embodiments of the present invention, the charges are not moved out of the light-sensitive pixel site at all. Rather, a preamplifier and other appropriate circuitry associated with each light-sensitive pixel, enables a charge (equal to, or proportional to, the charge currently in the light-sensitive cell) to be formed in an RSR, thus creating a copy of the light-sensitive pixel's charge in the RSR, without reducing the amount of charge in the light-sensitive pixel. Photogenerated charges may, consequently, continue to accumulate ("integrate") in the light-sensitive pixels, even after the charges in the light-sensitive pixels have been copied (i.e., have been "written") to storage cells. Continued integration of the photogenerated charges in the light-sensitive pixels may improve the signal-to-noise ratio of information obtained from the light-sensitive pixels.

Thus, a distinction between moving charges and non-destructively copying charges is important in the context of the present invention. "Non-destructively copying charge" herein means creating a copy of a charge that is in a first cell, such as a light-sensitive pixel, into another cell, without reducing the amount of charge in the first cell. As a result of a non-destructive copy operation, two approximately equal charges exist: one in the first cell and a second in the second cell. As noted above, CCD devices have been used to capture time-resolved data. However, during such a process, photogenerated charge is removed from a first active CCD site and moved to another site. As a result, the first site no longer has a charge. Such a process is referred to as "destructive moving." The CCD process is not necessarily destructive to the photogenerated charge, in that the charge is not destroyed; the charge is merely moved to another site. However, destructive moving is different than non-destructive copying, as defined herein.

In one mode of operation, the charges in the light-sensitive pixels are periodically copied to successive rows of the storage cells (RSRs). Thus, the RSRs store time-resolved information about the spectrum observed by the light-sensitive pixels. Each row of RSRs represents a different time period, during which the spectrum was imaged, and each RSR in a row represents information about a different portion (wavelength or range of wavelengths) of the spectrum. As discussed in more detail below, often only portions of the spectrum are of analytical interest. Thus, reading all the RSRs of a row may not be necessary. Furthermore, as discussed in more detail below, often only information collected during a particular period of time or during several periods of time may be of analytical interest. The time periods of interest may be different for each portion of the spectrum that is of interest. Thus, reading information from all the RSR rows may not be necessary. Reading only the RSRs of interest takes less time than reading all the RSRs would take. Thus, information regarding the RSRs of interest can be read, the linear sensor array can be cleared of charges and the linear sensor array can be made ready to acquire data from a subsequent spectroscopic event more quickly than if all the RSRs were to be read.

Pixel Decoder, RSR Decoder and RSR Readout Chain

Two decoders are employed in the embodiment shown in FIG. 2: 13-bit Pixel and 5-bit RSR Decoders. The 13-bit pixel address decoder (referred to as the 'Pixel Decoder') is responsible for selecting the pixel to be readout and the 5-bit RSR address decoder (referred to as the 'RSR Decoder') selects the RSR for read or write. For other embodiments, other numbers of address bits are used, as would be understood by one of ordinary skill in the art. The readout chain includes an amplifier and CDS circuit, which are connected to the Sense photogate of each Linear CID pixel.

Figure 5:
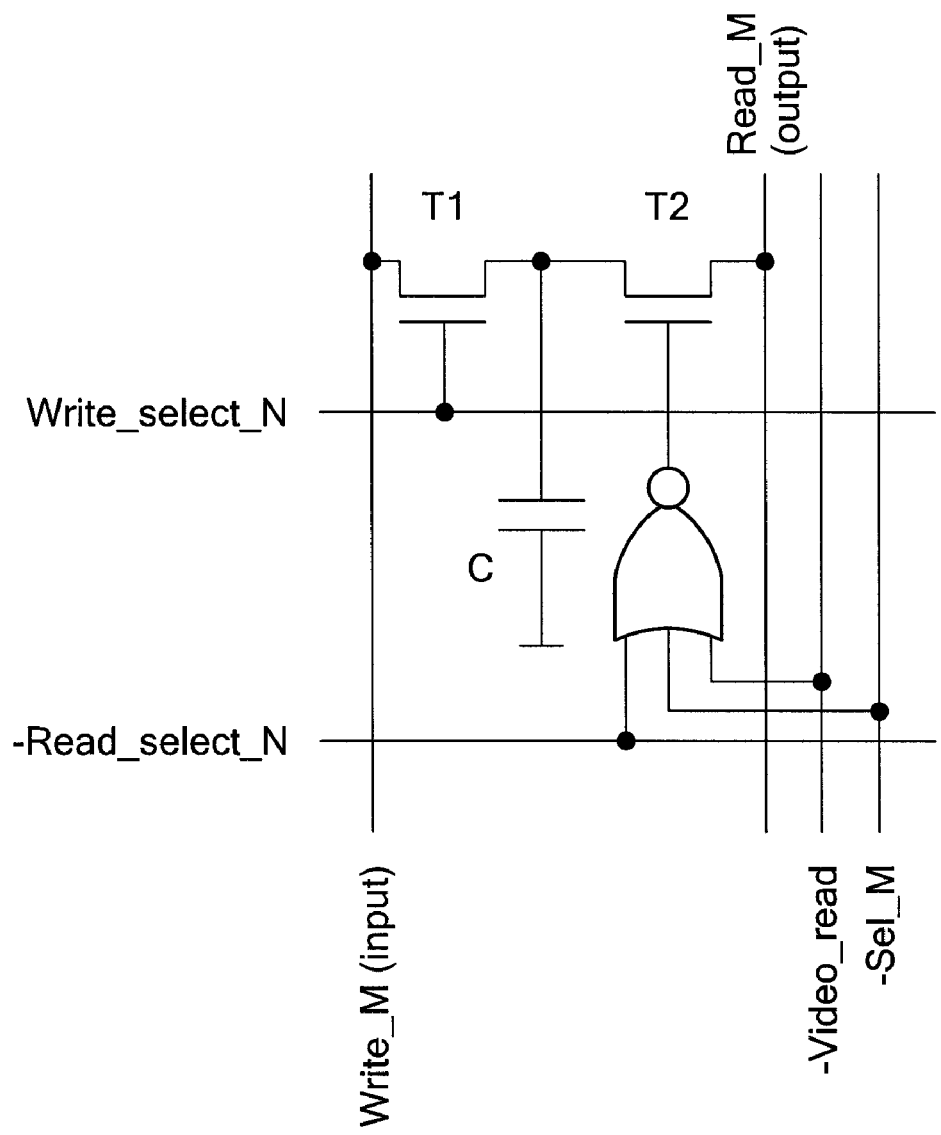
FIG. 5 is a schematic diagram of a Row Storage Register (RSR) cell, in accordance with an embodiment of the present invention.

As stated above, the RSRs are effectively randomly accessible analog memory devices. A schematic of a single RSR cell is shown in FIG. 5. The analog voltage information coming from the CDS circuit is stored as charge on the capacitor 'C.' This information is brought to the cell through the vertical bus 'Write_M,' which can be connected to the storage capacitor through the transistor switch 'T1.' In order to write row 'N' of the RSR, 'Write_select_N' is set 'high' by setting the input signal 'Write_M' to 'high' after the address 'N' is latched by the 5-bit RSR Decoder.

The RSR can be read through the vertical bus 'Read_M,' which leads to the input of the video amplifier. This bus can be connected to the storage capacitor 'C' through the transistor switch 'T2.' In order to read the row N, pixel M memory location, three conditions must be achieved. Firstly, the address 'N' must be latched in the 5-bit RSR Decoder. Secondly, pixel address 'M' must be latched by the 13-bit Pixel Decoder, and finally, the input signal 'Video_read' must be set 'high.' When these three conditions are achieved, the gate of transistor 'T2' is set 'high,' thereby closing the 'T2' switch and allowing the information on the RSR cell to be read out as a video signal.

Information about the charges in all or some of the RSRs may be selectively read out of the linear sensor array. The linear sensor array may include one or more analog-to-digital converters (ADCs) to digitize the amount of charge in the RSRs and to provide information about the amount of charge in the RSRs to a device external to the linear sensor array. Alternatively, the ADC(s) may be external to the linear sensor array. In one embodiment, the linear sensor array does not include an ADC; instead, the linear sensor array provides an analog signal to an external ADC or set of ADCs provided on one or more separate ICs.

All or a selected (contiguous or discontiguous) subset of the RSRs may be randomly addressed for reading. Selected RSR may be read, without reading the remaining RSRs. Thus, information about the pixels of interest at times of interest may be read out of the linear sensor array, and then the light-sensitive pixels may be cleared of charges. The RSRs of interest may be read in less time than would be required to read all of the RSRs, thereby providing an advantage over conventional two-dimensional CCD devices and linear CCD devices used for time-resolved spectroscopy.

Electronic Control System Architecture

Figure 6:
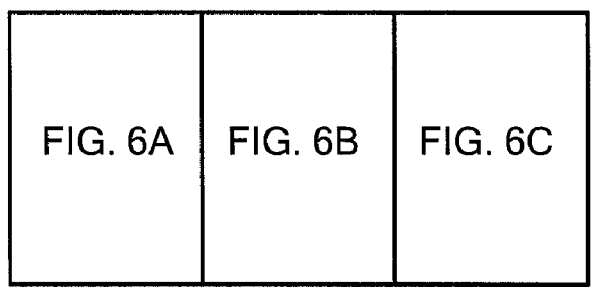
FIG. 6 provides a block diagram of an exemplary Dual Linear CID Image Control in accordance with an embodiment of the present invention.
Figure 6A:
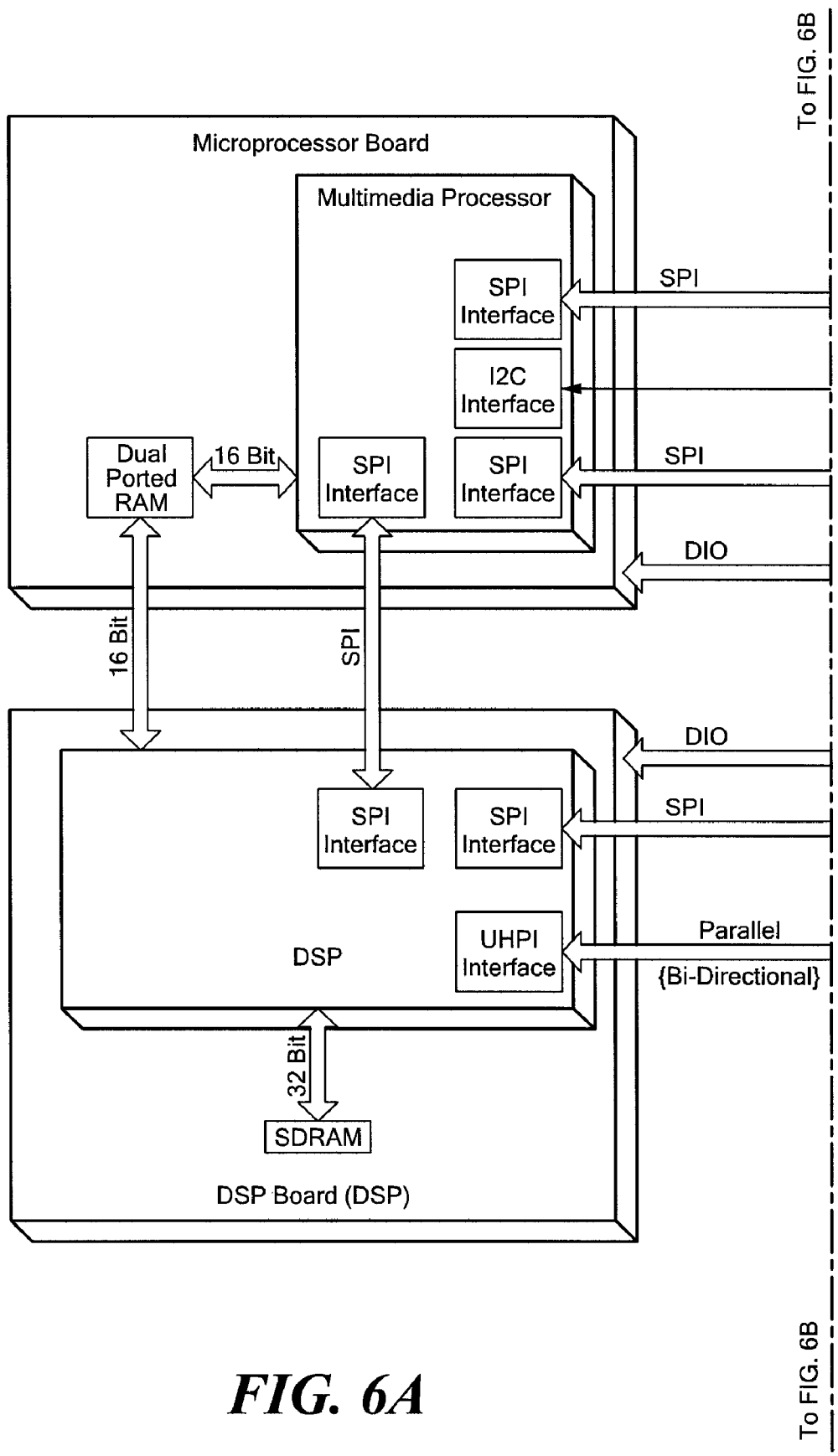
Figure 6B:
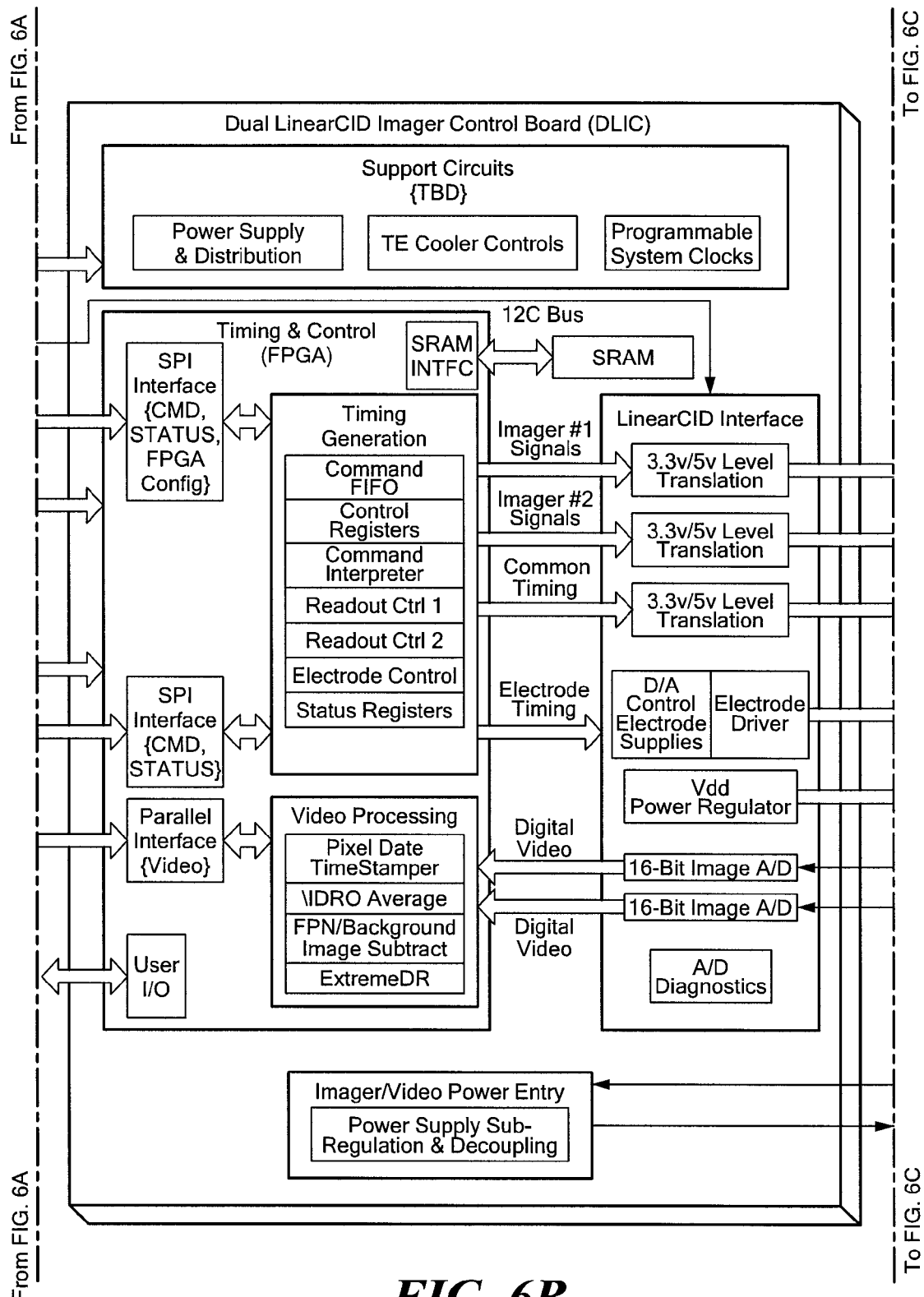
Figure 6C:
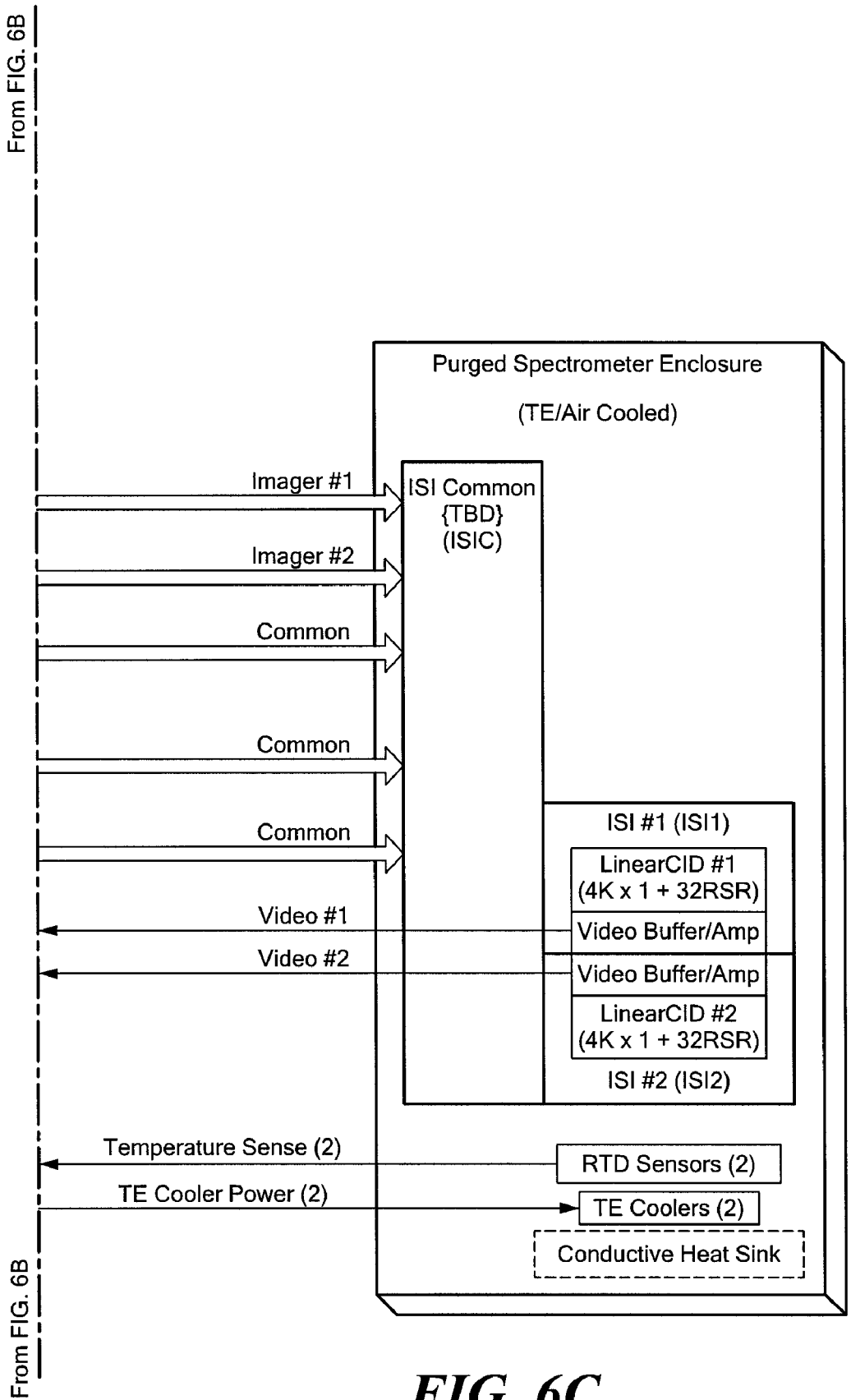

The linear sensor array may be controlled by a variety of electronic control systems. One embodiment of a linear sensor array control system is the Dual Linear CID Imager Control (DLIC) and Imager Specific Interface (ISI) sub-system intended for use in an optical emission spectroscopy Portable Alloy Analysis Instrument (PAAI). The DLIC-ISI sub-system could also be used with any other instruments in which a light signal is cross-dispersed, by an order sorter such as by a prism, so as to provide multiple orders of a diffraction grating across distinct linear arrays of detectors. A detailed block diagram of the exemplary DLIC is provided in FIG. 6.

The DLIC/ISI sub-system provides interface and control signals between a Digital Signal Processor (DSP) based controller and the dual Linear CID-Spectrometer sub-assembly. Such a sub-system is particularly suitable for interfacing with an OES spectrometer such as that described in U.S. Provisional Patent Application Ser. No. 60/891,408, filed Feb. 23, 2007, which is incorporated herein by reference. The spectrometer may contain dual (or any other numerosity of) thermoelectrically (TE) cooled Linear CID imagers.

A Linear CID device and the DLIC, as described herein, may: support readout of row storage registers (RSRs) for Time Delay Integration (TDI) mode (described below); provide 16-bit video signal digitization or analog signal readout; support destructive readout (see FIG. 4B followed sequentially by FIG. 4C), non-destructive readout (see FIG. 4B), global injection of photogenerated charge and segment injection of photogenerated charge (see FIG. 4C); support real-time fixed pattern noise (FPN) subtraction & direct readout Extreme Dynamic Range (described below) algorithm; support parallel imager readout (for any number of Linear CID imagers) and real-time image data transfer to the DSP. Additionally, an integral humidity sensor may be included in the DLIC interface. In preferred embodiments of the invention, the temperature of the Linear CID devices should be stabilized at a temperature below ambient to reduce dark current and improve signal-to-noise ratio.

Time Integration and Time Resolved Algorithms

The combined Linear CID and DLIC-ISI sub-system may be employed with a variety of algorithms to yield the time-integrated or time-resolved data of interest. The following algorithms are described: Time Delay Integration (TDI) algorithm, Time Resolved Spectroscopy (TRS) algorithm, Random Access Integration (RAI) algorithm, and the Extreme Dynamic Range (Extreme DR) algorithm.

Time Delay Integration (TDI) Algorithms

One purpose of the Time Delay Integration (TDI) algorithms contained in a system incorporating a Linear CID and DLIC-ISI sub-system is to provide accurate high-resolution time-resolved data for individual spectroscopic events occurring at a fixed repetition rate, such as spark optical emission spectroscopy (OES).

Figure 7:
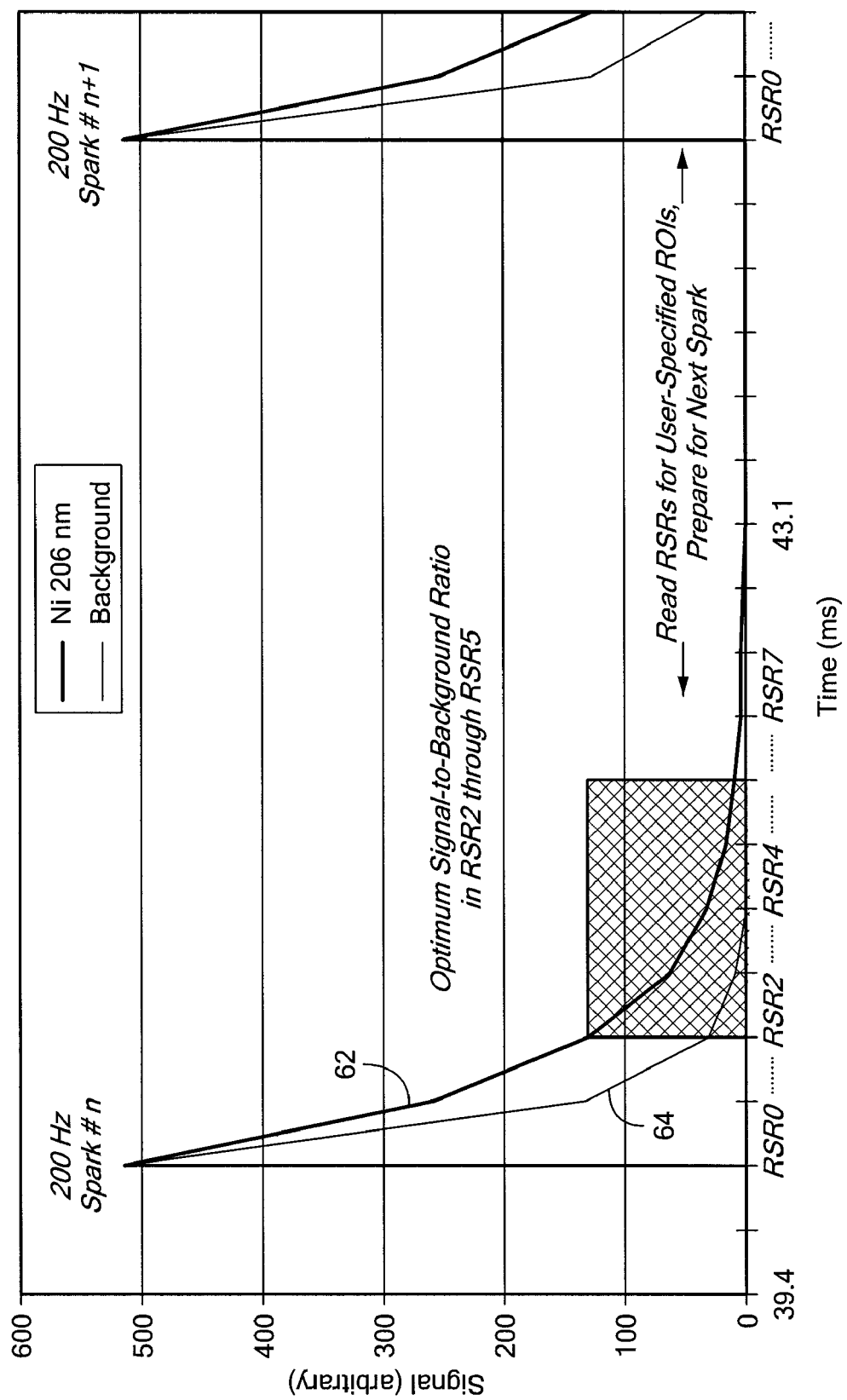
FIG. 7 depicts a hypothetical signal versus time profile from one individual spark discharge and the beginning of a second discharge at a 200 Hz spark rate.

In one embodiment, the TDI algorithms have adequate time resolution to store up to 32 RSR samplings of the signal from an individual spark discharge at a fixed time increment and to read those 32 RSR samplings into off-linear-sensor memory (typically, static random access memory, SRAM) before the next spark discharge. For example, if a spark is run at 200 Hz, there will be a spark discharge every 5 milliseconds (ms). FIG. 7 depicts two hypothetical signals 62 and 64, each plotted as a function of time, arising from one individual spark discharge and the beginning of a second discharge at a 200 Hz spark rate. The heavy signal profile 62 represents a detected signal at the 206 nm emission line associated with neutral nickel, whereas the light signal profile 64 represents the signal due to background emission near the Ni 206 emission line. The background signal 64 falls off more rapidly than the Ni 206 nm signal 62. Optimum signal-to-noise ratio (and, thus, detection limit) can be achieved by gating the observation window to that region where the signal-to-background ratio is maximized (e.g., between RSR2 and RSR5 in FIG. 7).

Figure 8:
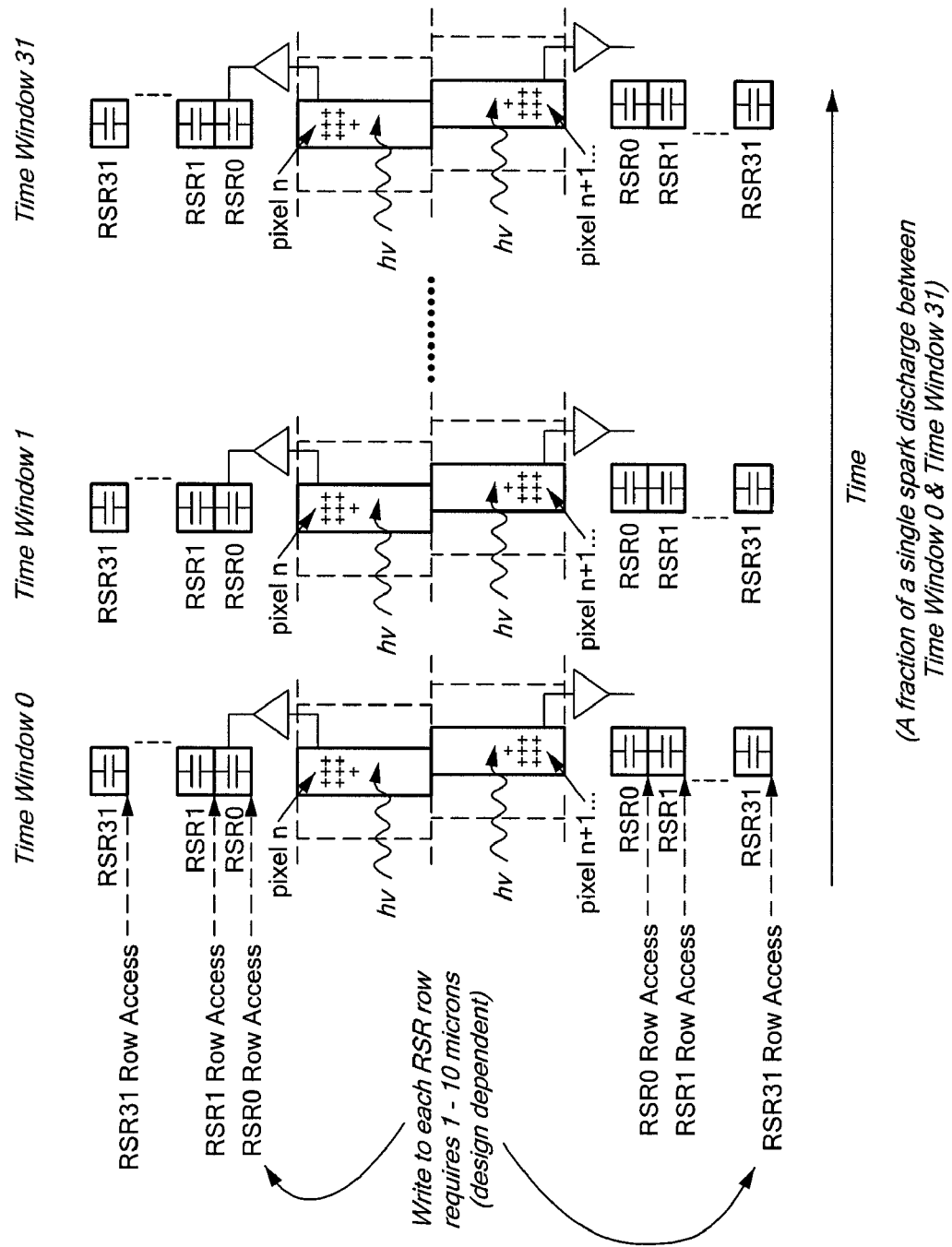
FIG. 8 provides a graphical representation of the 32 Row Storage Registers (RSR0-RSR31) on the Linear CID device, in accordance with a preferred embodiment of the present invention.

In order to accomplish this temporal gating in a region of maximum signal-to-background ratio, one embodiment of the Linear CID is capable of storing 32 time-resolved samplings of the spark discharge at fixed user-defined time increments. FIG. 8 provides a graphical representation of the 32 RSRs (RSR0-RSR31) on the Linear CID device. Other numbers of RSRs may be used in other embodiments.

An example of time-resolved spectroscopy is now provided with reference to FIG. 8. Suppose that the spark frequency is 200 Hz. Suppose optimum Ni 206 nm (pixel $X_{Ni}$=947, $dX_{Ni}$=11 pixels) signal-to-noise ratio occurs between 100 and 200 μs after the spark discharge. Suppose optimum Cr 267 nm (pixel $X_{Cr}$=1,387, $dX_{Cr}$=13 pixels) signal-to-noise ratio occurs between 140 and 280 μs after the spark discharge. In this case, the TDI mode would be set up to execute 32 individual 20-μs time samplings into the 32 RSRs, capturing a total of 640 μs after the spark discharge. Once the 640 μs is captured in 20-μs increments, the TDI algorithms extracts the Ni 206 nm data from RSR4 through RSR9 (between 100 and 200 μs after the discharge) for pixels 947 through 959 and the Cr 267 nm data from RSR6 through RSR13 (between 140 and 280 μs after the discharge) for pixels 1,387 through 1,400. It is possible to read the individual pixel RSRs at a 5 MHz pixel rate, so readout of these 55 RSRs for Ni 206 nm (5 RSRs for each of 11 pixels) and 91 RSRs for Cr 267 nm (7 RSRs for each of 13 pixels) requires a total of 29.2 μs. After the RSR readings are complete, all pixels on the Linear CID are cleared of photon-generated charge using a 10 μs global injection (see FIG. 4C).

Therefore, between the TDI samplings of the 32 individual 20-μs time samplings, the readout of the 146 pixel RSRs, and the injection of the device, a total of 679.2 μs elapses. Since there are 5,000 µs between spark discharges with a 200 Hz spark, there is ample time to perform this example TDI analysis between sparks.

The foregoing case is a relatively simple example in that analytically valuable information is obtained from a small subset of the RSRs. The following case is more complex. Suppose that the spark frequency is increased to 500 Hz (2 ms between discharges), and the TDI samplings occur at a 5-µs rate. (The fastest possible RSR row write time for this embodiment of the Linear CID is about 1-3 µs, and at this rate, the signal-to-noise may degrade.) Due to time constraints, it becomes impractical to read all 32 RSRs for all 4,160 pixels on one embodiment of the Linear CID device.

However, the majority of the spark OES spectrum between 150 nm and 800 nm is not analytically useful. In addition, even at the wavelengths of analytical interest, in a typical analysis, a user usually requires data from only a few RSRs. The RSRs of interest may change from wavelength to wavelength (i.e., pixel region to pixel region), but it may not be necessary to read all 32 RSRs for every wavelength of interest. Table 1 provides an estimate of the total number of RSRs that may be read versus spark frequencies ranging from 100 Hz to 1,000 Hz for one embodiment of the Linear CID. Note that even at the fastest spark frequency of 1,000 Hz, it is still possible to achieve a significant number of RSR readings (approximately 3,300) between spark discharges.

TABLE 1

Estimated Number of RSR Readings Versus Spark Frequency.

| Spark Frequency | Time Between Sparks (µs) | 32 Time Increments at 10 µs each (µs) | Linear CID Clear (µs) | Time for RSR Readings (µs) | Number of RSR Reads Allowed at 5 MHz |
|---|---|---|---|---|---|
| 100 Hz | 10,000 | 320 | 10 | 9,670 | 48,350 |
| 200 Hz | 5,000 | 320 | 10 | 4,670 | 23,350 |
| 400 Hz | 2,500 | 320 | 10 | 2,170 | 10,850 |
| 600 Hz | 1,667 | 320 | 10 | 1,337 | 6,685 |
| 1,000 Hz | 1,000 | 320 | 10 | 670 | 3,350 |

At relatively low spark frequency, the RSR row write time has only a minor impact on the number of individual RSR pixel readings that can be accomplished between spark discharges, as can be seen in the following example. Suppose that the spark frequency is 200 Hz (5 ms between discharges) and suppose that the user requests the 32 TDI samplings at 10 µs per sampling. In this case, after subtracting the 320 µs for the TDI samplings, and the 10 µs for the injection of the Linear CID, there will be 4,670 µs remaining for RSR readings. At a 5 MHz RSR read rate, that equates to 23,350 individual RSR pixel readings. On the other hand, if the TDI sampling increment is reduced to 1 µs, then after subtracting the 32 µs for the TDI samplings, and the 10 µs for the injection of the Linear CID, there will be 4,958 µs remaining for RSR readings. At a 5 MHz RSR read rate, that equates to 24,790 individual RSR pixel readings, or about 6% more readings than can be accomplished with the 10-µs TDI sampling rate.

Given a spark frequency (which determines the interval of time between spark discharges), the TDI sampling rate, and the amount of time necessary to clear the Linear CID device of photon-generated charge, there is a limit to the number of pixel RSRs that can be read before the next spark discharge. As depicted in Table 1, if the spark frequency is 400 Hz, the TDI sampling rate is 10 µs, and the Linear CID clear time is 10 µs, then there are 2,170 µs available for individual RSR pixel readouts. A 5 MHz RSR pixel read rate corresponds to a total 10,850 RSR pixel readings. If, instead of all 32 RSR rows, it is necessary to interrogate an average of only 5 RSRs per pixel, then the TDI experiment can be performed on as many as 2,170 pixels (or a little more than half of an embodiment of a Linear CID device with 4,160 pixels).

The total number of individual pixel RSRs that may be interrogated between spark emissions is constrained by the spark frequency, the TDI sampling rate, and the Linear CID injection time. Within these constraints, any number of pixel regions (defined by Xo, dX) can be observed.

Within certain embodiments of the present invention, a number of pixels in the linear CID array exceeds the number of requisite spectral channels. Additional pixels to either side of those used for spectral imaging may serve to relieve alignment tolerances. Moreover, the vertical pixel dimension (i.e., transverse to the array direction) may be larger than the image size, again relieving alignment tolerances with respect to the placement of the array in relation to the dispersing element of a spectrometer, for example. Moreover, when the number of charge-transfer device light-sensitive pixel cells exceeds a specified number of exposed charge-transfer device light-sensitive pixel cells, the extremal spectral channel may correspond to a specified pixel that may vary due to variations in alignment or other operating conditions. Thus, the registration of wavelength to pixel number may vary dynamically during the course of operation of an instrument in which the invention is incorporated.

Time Resolved Spectroscopy Algorithm

The purpose of the Time Resolved Spectroscopy (TRS) algorithms contained in a system incorporating a Linear CID and DLIC-ISI sub-system is to monitor the signal with respect to time for a series of user-defined Regions of Interest (ROIs) on the Linear CID device.

The scope of the present invention is not limited with respect to the spectroscopic techniques to which it may be applied. Examples of such techniques include laser induced breakdown spectroscopy (LIBS), spark optical emission spectroscopy (OES), ion chromatography inductively coupled plasma optical emission spectroscopy (IC-ICP-OES), high performance liquid chromatography ICP-OES (HPLC-ICP-OES), and flow injection analysis ICP-OES (FIA-ICP-OES). The Linear CID TRS algorithms may also be employed advantageously for other time resolved applications, such as UV-visible absorbance detection for HPLC, time resolved fluorescence, etc.

Figure 9:
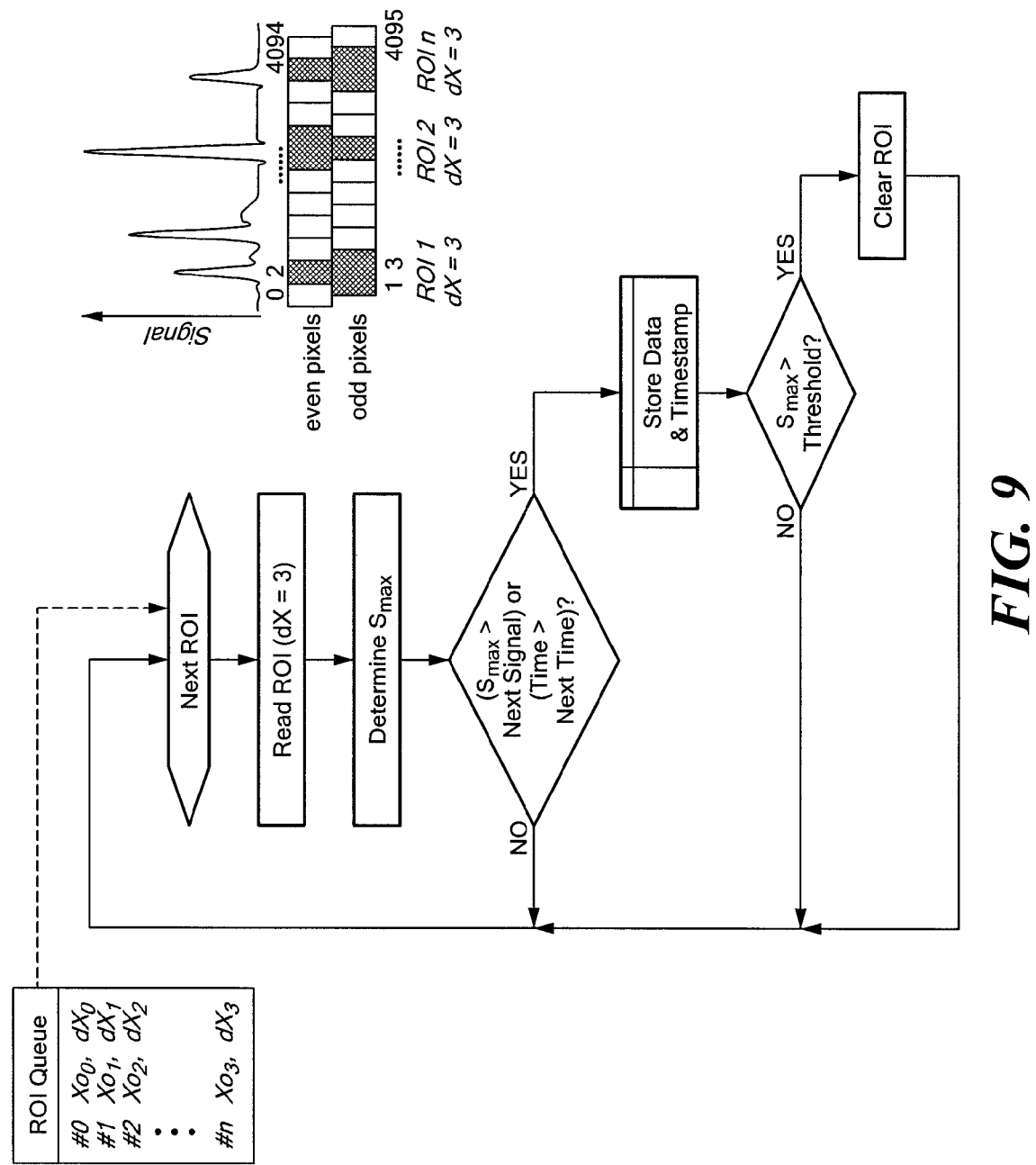
FIG. 9 provides a basic flow chart for time resolved spectroscopy using a Linear CID in accordance with embodiments of the present invention.

The basic flow chart for an exemplary TRS algorithm is shown in FIG. 9. While other algorithms may be employed within the scope of the present invention, the algorithm described here, by way of example, acquires signal data points in time by monitoring both the elapsed time and a current signal. If either the time or signal, at which a new point is to be acquired, have been reached, the Linear CID ROI (defined by $X_o$ and dX) is read, and the data is stored in DLIC-ISI sub-system random access memory (RAM).

The details of the algorithm follow. The user defines one or more ROI including the starting pixel ($X_o$) and region size (dX) on the Linear CID. A graphical user interface (GUI) may be employed for this purpose. The algorithm then assembles these ROIs into a circular ROI Queue.

The first step in the algorithm is to read the ROI at the top of the circular observation queue. Note that all readings performed on the Linear CID are nondestructive with respect to the photon-generated charge. This implies that any pixel on the Linear CID can be interrogated at any point in time, without affecting the photon-generated charge in that pixel site (or any other pixel site). After reading the ROI, the algorithm determines the maximum pixel signal ($S_{max}$) in the ROI, i.e., the signal in the pixel within the ROI that has the largest accumulated photogenerated charge. This maximum signal ($S_{max}$) is then compared against a user-defined signal increment, and the current exposure time is compared against a user-defined time increment. If either the user-defined signal increment or the user-defined time increment have been reached, then the ROI pixel data is stored in DLIC RAM, along with a timestamp for the reading. If neither the user-defined signal increment nor the user-defined time increment has been reached, then the ROI is cycled to the bottom of the observation queue, and the next ROI in the circular queue is interrogated.

The user-defined signal increment and user-defined time increment may be defined by the user globally for all ROIs in a GUI. For example, the signal increment may be set as a percentage of the Linear CID device full well capacity, and by setting the signal increment to a lower value, the user is able to force the algorithm to acquire time resolved pixel data more frequently while the signal is rising rapidly. In this manner, time profiles of transient events, such as chromatographic peaks, may be more precisely defined.

In one embodiment, it is possible to set the time increment values as low as about 1 µs and as high as approximately 10 seconds. Typically, the time increment is set to values between about 0.001 and about 1 second. If the user desires data points to be taken at a fixed time increment, then the signal increment is set to 100% of full well capacity. In this manner, the time increment is always reached before the signal increment.

After a time resolved data point is acquired, the algorithm checks the maximum signal ($S_{max}$) in the ROI against a threshold signal (typically 75% of Linear CID full well capacity), i.e., against a predetermined value or a value entered by a user (as described above). If the signal exceeds the threshold level, then it may be approaching saturation and the ROI is cleared of photo-generated charge. In this manner, the signal on the ROI can be prevented from exceeding the saturation level (i.e., full well capacity) of the Linear CID. At this point in the algorithm, the ROI is cycled to the bottom of the observation queue, and the next ROI in the queue is interrogated.

Figure 10A:
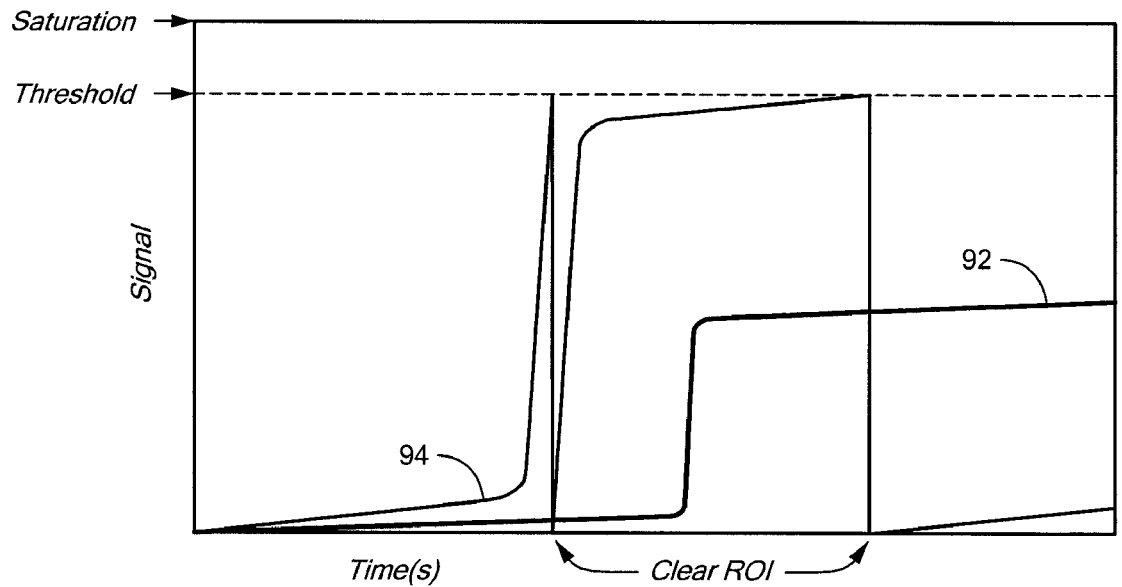
FIGS. 10A-10C depict examples of hypothetical signals versus time profiles for two regions of interest acquired simultaneously using the Time Resolved Spectroscopy (TRS) algorithm in accordance with embodiments of the present invention.
Figure 10B:
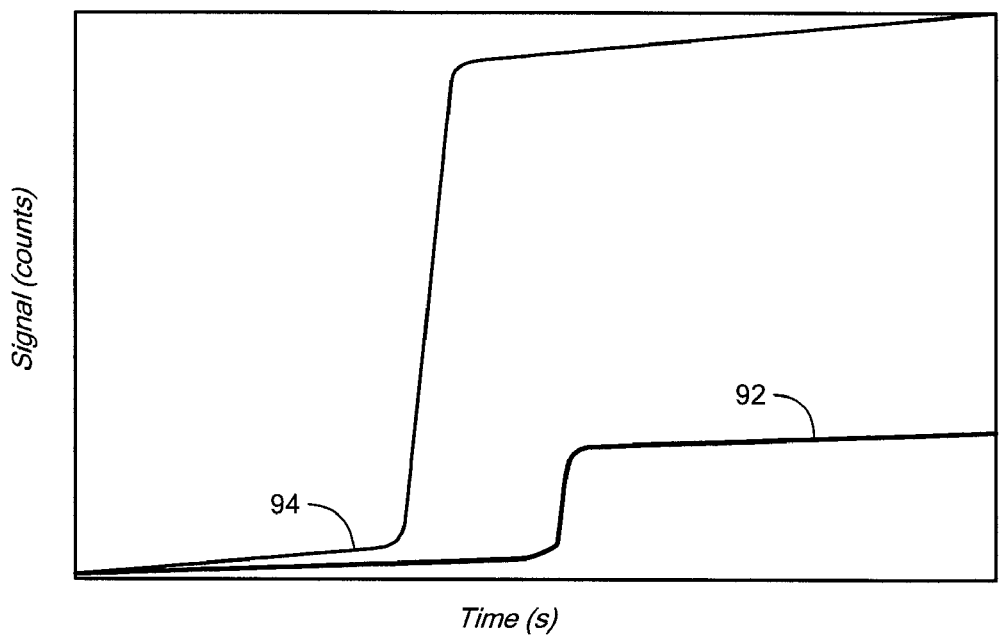
Figure 10C:
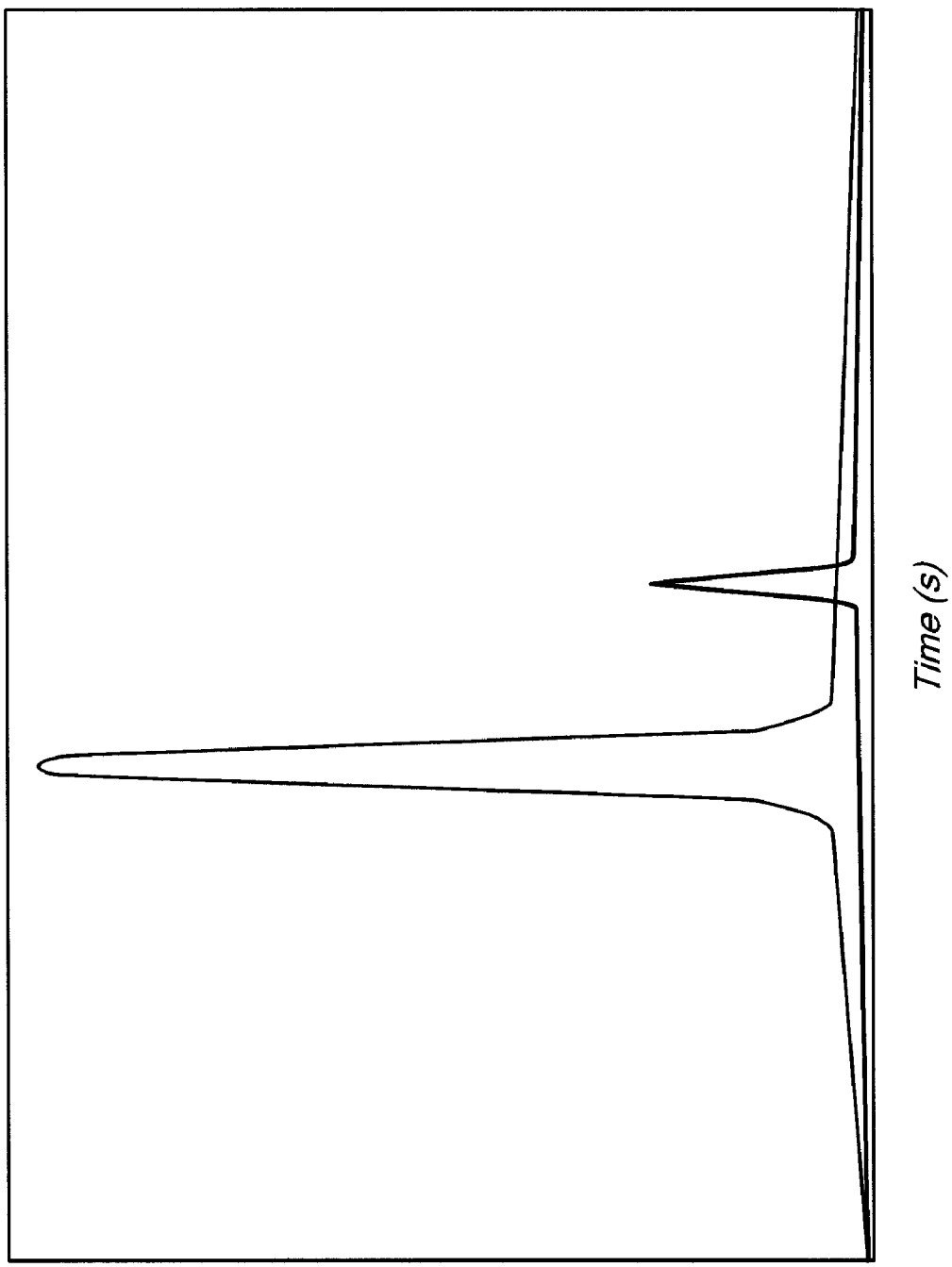

FIGS. 10A-10C depicts examples of two cases where clearing individual ROIs, during the course of signal integration is either indicated, or not. The signal versus time profiles for the two ROIs depicted in FIGS. 10A-10C are acquired simultaneously using the TRS algorithm. In FIG. 10A, there is a Gaussian spike in the signal of the ROI represented by profile 92 approximately 60% of the way through the exposure. However, as shown in FIG. 10A, signal 92 never reaches the threshold level and, therefore, it is never necessary to clear the ROI. A simple integral signal-versus time profile of the ROI's Gaussian peak is observed.

The situation represented by ROI profile 94 in FIG. 10A, however, is more complex. An integral Gaussian signal spike is observed on this ROI approximately 40% of the way through the exposure. The signal spike is of sufficient intensity to cause the signal to reach the threshold signal level (75% of full well capacity) and, therefore, it is necessary to clear the ROI of photogenerated charge as the signal spike is eluting. After the first ROI clearing, the signal continues to rise for the remainder of the integral Gaussian spike. After the spike has completely eluted, the signal continues to rise due to simple background signal until approximately 70% of the way through the exposure when the signal level again reaches the threshold level. At this point, the ROI is cleared again. After the clearing, the signal continues to rise due to background until the user-defined exposure time is reached.

After completion of the TRS exposure, the ROI clearing points are resolved by adding the signal achieved at the point prior to the ROI clear to all signal levels measured after the ROI clear. The result of this signal correction process is displayed in FIG. 10B, where the contiguous integrated signal level is observed for both ROI signals 92 and 94. The time derivatives of the ROI signals of FIG. 10B are shown in FIG. 10C. Optionally, the graphical user interface allows the user to display the plots in raw signal mode showing all of the ROI clear points (as in FIG. 10A), in integral mode (as in FIG. 10B), in first derivative mode (as in FIG. 10C), and possibly in second derivative mode (not shown).

Figure 11:
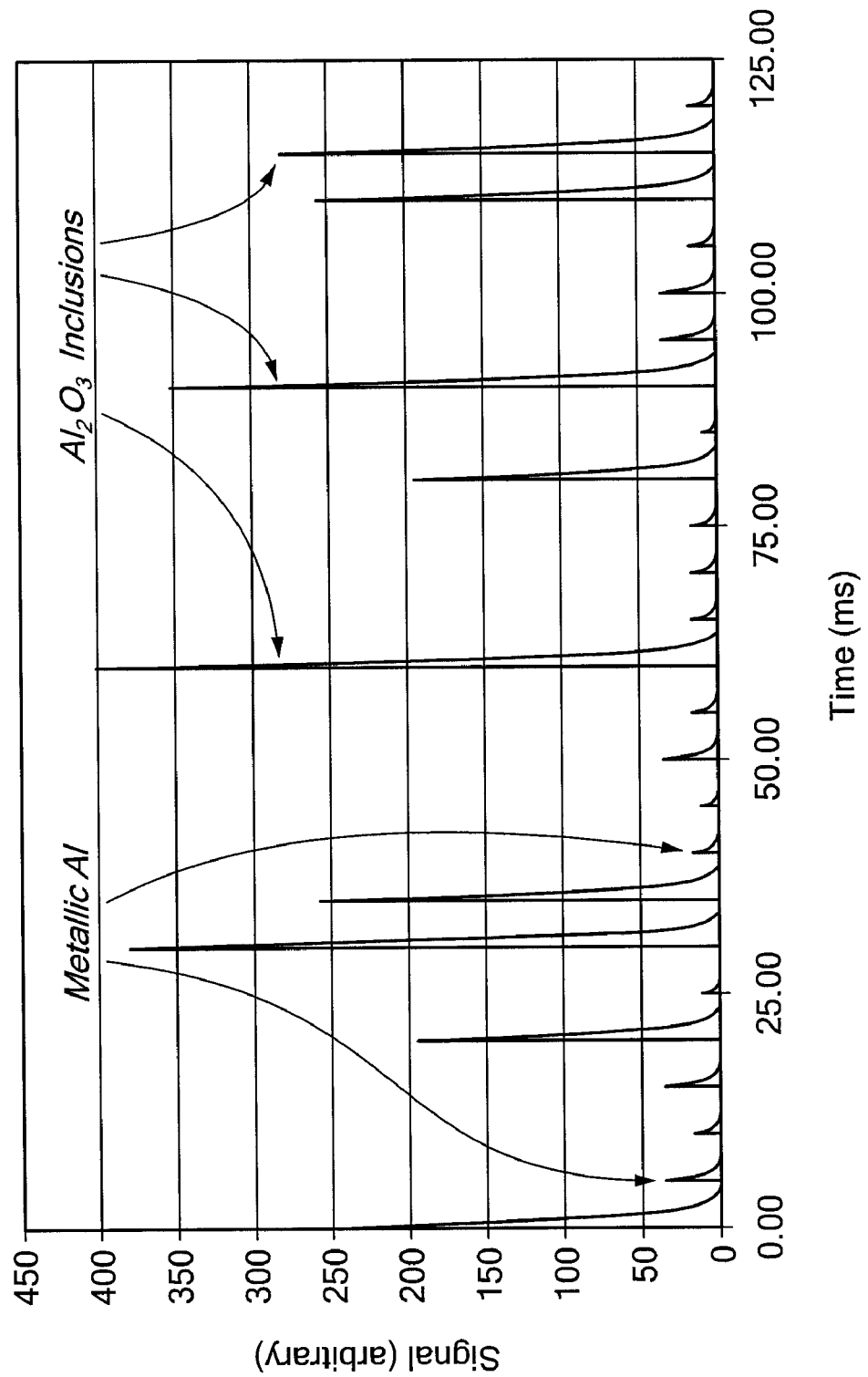
FIG. 11 depicts a hypothetical signal versus time profile acquired using the TRS algorithm of numerous spark discharges depicting the appearance of the signals from distinct elemental species.

FIG. 11 demonstrates one potential application of the TRS algorithm. With the level of time resolution provided by embodiments of the invention, it is possible to resolve individual OES spark discharges in time, and with the ability to resolve individual spark discharges, it is possible to perform elemental speciation. For example, in the analysis of steel, it is useful to be able to quantify not only the total aluminum content, but also to quantify $Al_2O_3$ inclusions ("insoluble" aluminum) and elemental metallic Al ("soluble" aluminum). In the hypothetical first derivative TRS scan of the Al 308 nm emission shown in FIG. 11, the more intense peaks are due to individual sparks striking $Al_2O_3$ inclusions, and the weaker peaks are due to individual sparks striking locations with elemental metallic Al. With the data from such a TRS scan, the appropriate aluminum analysis statistics may be generated and total aluminum as well as $Al_2O_3$ and metallic Al concentrations may be determined.

Random Access Integration

The purpose of the Random Access Integration (RAI) algorithms contained in a system incorporating a Linear CID and DLIC-ISI sub-system is to monitor the total integrated signal over a user-defined period of time for a series of user-defined Regions of Interest (ROIs) on the Linear CID device.

The RAI algorithm controls the effective exposure time from ROI to ROI based upon the experimentally observed photon flux, thereby preventing Linear CID saturation on the ROIs, whenever possible. The algorithm may also vary the number of nondestructive reads (NDROs), so as to force the signal-to-noise ratio into a photon shot noise limited domain wherever possible.

Figure 12:
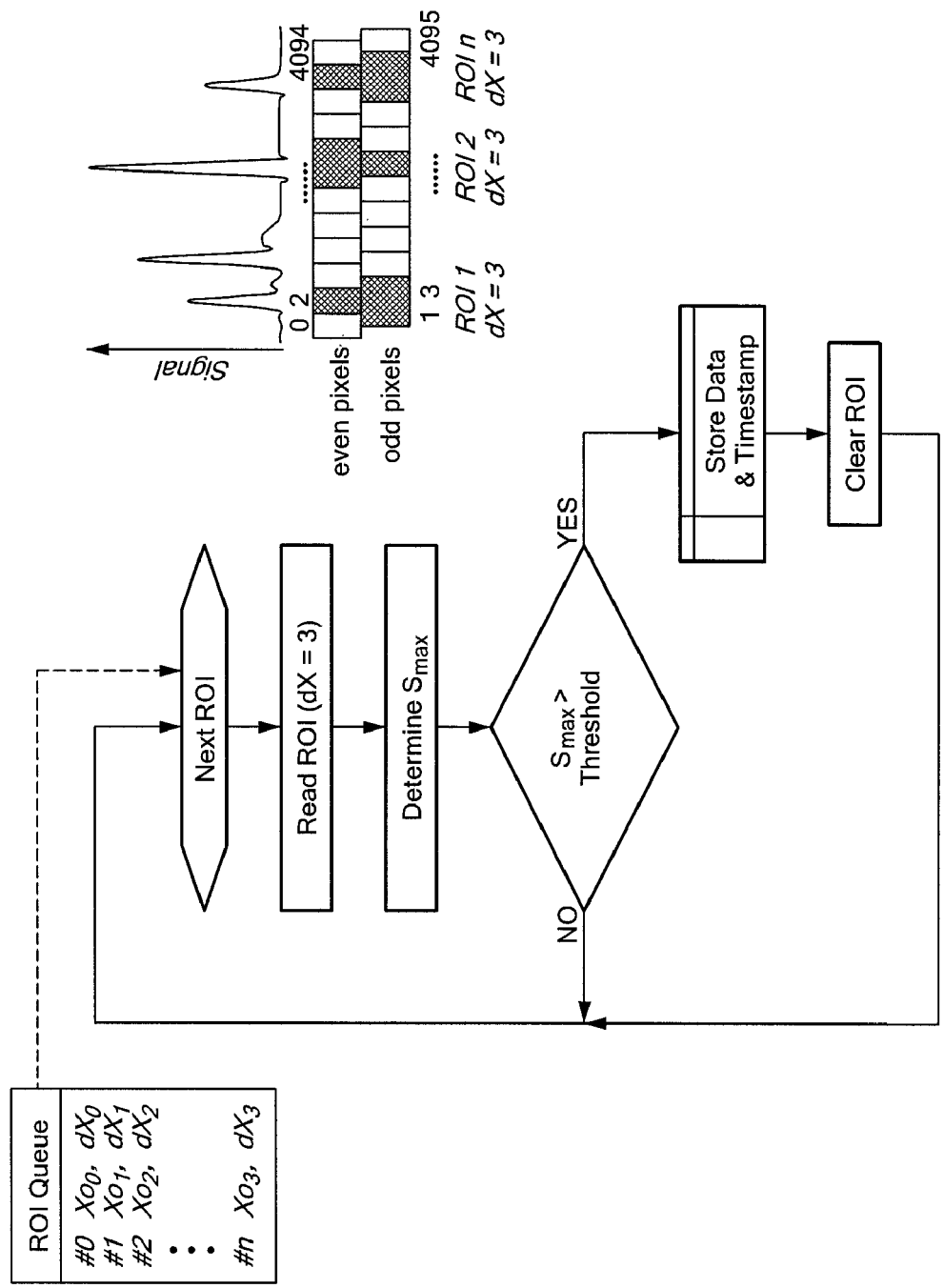
FIG. 12 is a flow chart depicting the flow of steps performed in accordance with the Random Access Integration (RAI) algorithm in accordance with embodiments of the present invention.

The basic flow chart for the algorithm is described with reference to FIG. 12. An ROI is moved to the top of the ROI Queue, and the ROI is read nondestructively. The algorithm then checks the maximum pixel signal in the ROI against a Threshold signal, which is typically set to about 75% (or another suitable value) of the full well signal. If the maximum pixel signal is not above the Threshold signal, the ROI is cycled to the bottom of the ROI Queue. If the maximum signal on the ROI is above the Threshold signal, then the pixel data and a timestamp from the ROI reading are stored in RAM, and the ROI is cleared of photogenerated charge using a segment injection command. At this point, the ROI is cycled to the bottom of the ROI Queue, and the process is repeated for the next ROI in the queue. The results of this process are depicted in FIG. 13.

If the signal on any given ROI reaches threshold signal during the user-defined exposure period (typically 5 to 60 seconds), then only a single nondestructive read is required to force the signal-to-noise ratio into a photon shot noise limited domain. However, if the signal on a given ROI does not reach threshold during the user-defined exposure period, then multiple nondestructive reads may be employed on the final reading to force the signal-to-noise ratio into a photon shot-noise-limited domain.

Figure 13:
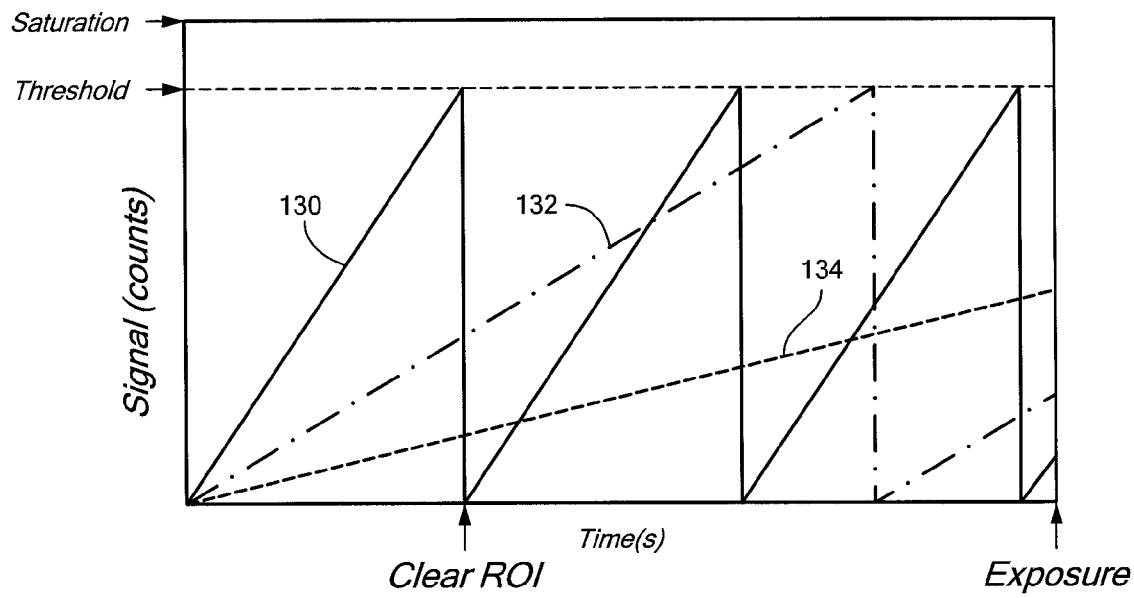
FIG. 13 shows the signal as a function of time in the case of three ROIs interrogated using the RAI algorithm of FIG. 12.

FIG. 13 depicts hypothetical signal versus exposure time profiles for three ROIs when a steady-state source (i.e., an emission source whose photon flux varies with time, at most, slowly on the timescale of data acquisition), such as in the case where inductively coupled plasma (ICP) is employed. The ROI represented by the profile 130 is intensely illuminated. At three evenly spaced intervals, the signal on the ROI reaches the Threshold signal level. At these points, the pixel data for the ROI must be time-stamped and stored, and the ROI must be cleared in anticipation of the next cycle. At the end of the user-defined exposure period (Exposure Time), the data from the three integrate-inject cycles and the data from the final reading taken at the Exposure Time are summed to yield the time integrated signal data for the ROI. The ROI represented by the profile 132 is less intensely illuminated. It has only one integrate-inject cycle before the user-defined Exposure Time expires and it is read for the final time. The ROI represented by the line 134 is weakly illuminated. The signal on the ROI does not reach the threshold value during the user-defined Exposure Time. The pixel data for the ROI is stored once and only once after the Exposure Time has expired. The number of nondestructive readings (NDROs) used to read the ROI is set so as to force the signal to noise ratio into a photon shot noise limited domain if possible. Note that all three ROIs are observed during the same time interval irrespective of the signal intensity. In this manner, the linear dynamic range of the Linear CID system can be extended to match the linear dynamic range of the source (such as between approximately six to eight orders of magnitude).

Extreme Dynamic Range Algorithms

The purpose of the Extreme Dynamic Range (Extreme DR) algorithms contained in a system incorporating a Linear CID and DLIC-ISI sub-system is to monitor the total integrated signal over a user-defined period of time over all pixels on the Linear CID device with extended dynamic range. The Extreme DR algorithm controls the effective exposure time from ROI to ROI based upon the experimentally observed photon flux, thereby preventing saturation on all Linear CID pixels, whenever possible.

The Extreme DR algorithm is executed as follows: The Linear CID is exposed to the emission source for a short 'pre-exposure' period. The duration of the pre-exposure is typically between 0.4% and 1% of the user-defined exposure period. Based upon the Linear CID pixel signals from the pre-exposure and the user-defined exposure period, those pixels (ROIs) on the Linear CID achieving the saturated signal level (full well capacity or other suitable value) at or before the user-defined exposure period are identified. The Linear CID device is then globally cleared of photongenerated charge, and an exposure of the user-defined duration is begun. During the exposure, the ROIs identified by the pre-exposure routine are read and cleared of photon generated charge at algorithmically-determined intervals as depicted in FIG. 14.

Figure 14:
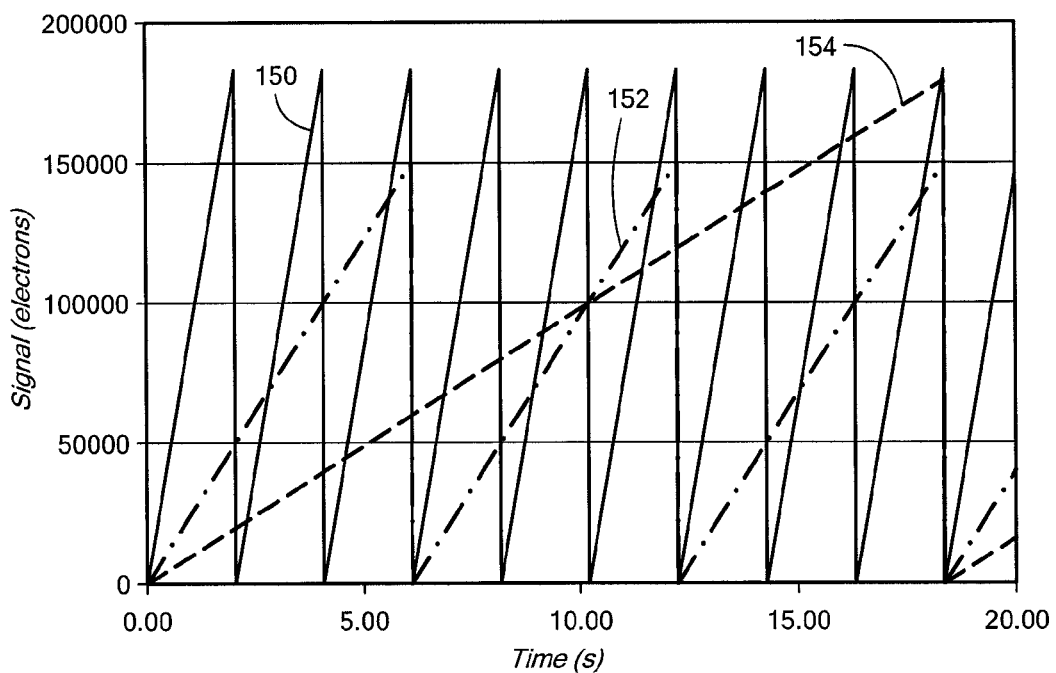
FIG. 14 shows the signal as a function of time in the case of three ROIs interrogated using the Extreme Dynamic Range (DR) algorithm.

FIG. 14 depicts hypothetical signal versus exposure time profiles for three ROIs identified by the pre-exposure routine. The ROI represented by the profile 150 is intensely illuminated. At nine evenly spaced intervals, the ROI must be read, the pixel data must be time-stamped and stored, and the ROI must be cleared in anticipation of the next cycle. At the end of the user-defined exposure period, the data from the nine integrate-inject cycles and the data from the final reading taken at the user-defined exposure time are summed to yield the time integrated signal data for the ROI. The ROI represented by the profile 152 is less intensely illuminated. It has only three integrate-inject cycles before the user-defined exposure time expires and it is read for the final time. The ROI represented by the line 154 is weakly illuminated. It has only one integrate-inject cycle before the user-defined exposure time expires and it is read for the final time.

In order to minimize the overhead associated with the parallel CDS sampling of the Linear CID pixels, all ROIs identified by the pre-exposure algorithm are read using the same parallel CDS sampling. In the example depicted in FIG. 14, the ROI represented by profile 150 is read with CDS samplings at 2-second intervals. In every third 2-second CDS sampling, the ROI represented by profile 152 is also read, and in every ninth 2-second CDS sampling, the ROI represented by profile 154 is also read.

Note that all ROIs identified by the pre-exposure routine are observed during the same user-defined exposure period irrespective of the signal intensity. In this manner, the linear dynamic range of the Linear CID system can be extended to match the linear dynamic range of the source (such as between approximately six to nine orders of magnitude).

After the user-defined exposure period has expired, all Linear CID pixels that were not in the ROIs identified by the pre-exposure are read. In this manner, the signal data for all pixels on the Linear CID is obtained. The pixel data for more intensely illuminated pixels, such as those represented by profiles 150, 152, and 154 in FIG. 14, is acquired during the user-defined exposure period, and the pixel data for more weakly illuminated pixels is acquired after the user defined exposure period.

In this manner, utilizing the random pixel addressing, nondestructive read, and selective pixel clear features of the Linear CID and DLIC-ISI sub-system, the Extreme DR exposure mode reads and resets intensely illuminated pixel regions at a frequency determined by the experimentally observed photon flux. In this mode, dynamic range is NOT limited by full well capacity. Dynamic range is instead limited by the maximum frequency at which an ROI can be read and cleared. This frequency can be in the 300 to 10,000 Hz range (0.1 to 3.3 millisecond cycles).

In one embodiment of the Extreme DR algorithm, the maximum frequency at which an ROI can be read and cleared, and hence, the maximum dynamic range that can be achieved, is limited by the duration of the pre-exposure. For example, if the user-defined exposure time is 60 seconds, and the pre-exposure time is 0.30 seconds, then the maximum frequency at which an ROI can be read and cleared may be limited to approximately 300 Hz. In this and other similar cases, the dynamic range can be further extended by performing a second pre-exposure of shorter duration. In the example stated here, a second pre-exposure of 0.03-seconds duration may be performed. The Linear CID pixel data from the second 0.03-second pre-exposure would be used to identify ROIs that saturate the Linear CID pixels in exposure times between 0.0 and 0.3 seconds (the duration of the first pre-exposure), and the first 0.3-second pre-exposure would be used to identify ROIs that saturate the Linear CID pixels in exposure times between 0.3 seconds and the full user-defined exposure time. The result would be an increase in the maximum frequency at which an ROI can be read and cleared up to approximately 3000 Hz, and an order of magnitude increase in dynamic range. In some embodiments, the order of these pre-exposures may be reversed. In some embodiments, the duration of one or both of the two pre-exposures may be automatically calculated. In one embodiment, the duration of the shorter pre-exposure may be a predetermined or user-specified fraction of the longer pre-exposure.

Generally stated, the dynamic range may be extended for any imaging system that associates one or more scalar values with ordered elements of a space, in any number of dimensions. The scalar values are the values that characterize a signal response to an excitation, say, a detected intensity on a particular detector element. The ordered elements of the space include at least one region of interest defined as a subset of the ordered elements of the space. Each region of interest is characterized by a threshold time which corresponds to the time for one of the elements of the region of interest to saturate with charge. To set up the imaging system for imaging, the imaging system is first exposed to the excitation for a first pre-exposure time to determine the threshold time for all regions of interest whose threshold time exceeds a specified duration. Then, it is exposed to the excitation for a second pre-exposure time shorter than the first pre-exposure time to determine the threshold times for regions of interest whose threshold time is shorter than the specified duration. On the basis of the determined threshold times, values of the ordered elements of the space are read and reset in accordance with the threshold times determined for corresponding regions of interest.

While integrated circuits having 4,160 light-sensitive pixels have been described herein, other numbers of light-sensitive pixels may be included. In particular, it is desirable that the number of light-sensitive pixels provided exceed the number of spectral channels actually employed, both to relieve alignment tolerances, and to provide for dynamically variable registration of wavelength to pixel number.

Furthermore, although integrated circuits having one-dimensional arrays of light-sensitive pixels have been described, two-dimensional arrays of light-sensitive pixels may be included. In such a case, a separate set of RSRs may be provided for each row of light-sensitive pixels. In one embodiment, each set of RSR is implemented as a separate plane. In other aspects, a two-dimensional device operates in a manner similar to manner described above, i.e., copies of the charges in all the light-sensitive pixel cells are copied in parallel to a selected set of RSRs. Such a device may be used to provide time-resolved two-dimensional images, including spectra and other types of images.

Exemplary principles applicable to the architecture of a Linear CID sensor are described herein with reference to the block diagram depicted in FIG. 2, and where reference is made to particular numbers of pixels and/or RSRs, those are by way of example only. Similarly, the principles are applicable to hybrid integrated circuits, such as ones in which the light-sensitive pixels are formed on one substrate, and the row storage registers are formed on another substrate, and the two substrates are joined, such as by indium-bump bonding. (Such bonding is described in James G. Mainprize, et al., "A slot-scanned photodiode-array/CCD hybrid detector for digital mammography," Jun. 25, 2002, Department of Medical Biophysics, University of Toronto, Sunnybrook and Women's College Health Science Centre, Toronto, Ontario, M4N 3M5, Canada, the contents of which are incorporated by reference herein.) The principles are also applicable to other combinations of substrates or integrated circuits with sensors and substrates or integrated circuits with storage cells.

A spectrum analyzer has been described as including a processor controlled by instructions stored in memory. The memory may be random access memory (RAM), read-only memory (ROM), flash memory or any other memory, or combination thereof, suitable for storing control software or other instructions and data. Some of the functions performed by the spectrum analyzer have been described with reference to flowcharts. Those skilled in the art should readily appreciate that functions, operations, decisions, etc. of all or a portion of each block, or a combination of blocks, of the flowcharts may be implemented as computer program instructions, software, hardware, firmware or combinations thereof. Those skilled in the art should also readily appreciate that instructions or programs defining the functions of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including computer networks. In addition, while the invention may be embodied in software, the functions necessary to implement the invention may alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

While the invention is described through the above-described exemplary embodiments, it will be understood by those of ordinary skill in the art that modifications to, and variations of, the illustrated embodiments may be made without departing from the inventive concepts disclosed herein. Moreover, while the preferred embodiments are described in connection with various illustrative data structures, one skilled in the art will recognize that the system may be embodied using a variety of data structures. Furthermore, disclosed aspects, or portions of these aspects, may be combined in ways not listed above. Accordingly, the invention should not be viewed as limited.

What is claimed is:

1. A method for analyzing light, characterized by a spectrum, with time resolution, the method comprising:
   (a) illuminating a one-dimensional array of charge-transfer device light-sensitive pixel cells with the spectrum, such that each light-sensitive cell is illuminated by a different portion of the spectrum, thereby creating electric charges in one set of the light-sensitive cells;
   (b) non-destructively copying the charges in the light-sensitive cells to a first set of respective storage cells co-located with the light-sensitive cells in an integrated circuit, wherein the non-destructive copying is performed without moving the charges in the light-sensitive cells to another site;
   (c) periodically repeating (b) with respect to a different set of storage cells in the integrated circuit; and
   (d) providing information about the charges stored in at least some of the storage cells to a component external to the integrated circuit.

2. A method as defined in claim 1, further comprising allowing electric charges to accumulate in the light-sensitive cells for at least some of the repetitions of (b).

3. A method as defined in claim 1, further comprising, after performing (b) at least once, clearing the electric charges in a subset of the light-sensitive cells.

4. A method as defined in claim 3, further comprising a step of specifying the subset of light-sensitive cells from which electric charge is to be cleared.

5. A method as defined in claim 1, further comprising providing at least 2,000 light-sensitive cells on the integrated circuit.

6. A method as defined in claim 1, further comprising providing at least 16 storage cells on the integrated circuit for each pixel cell.

7. A method as defined in claim 1, further comprising storing the provided information in a memory external to the integrated circuit.

8. A method as defined in claim 1, wherein providing the information comprises providing information about the charges stored in all of the storage cells to the component external to the integrated circuit.

9. A method as defined in claim 1, wherein providing the information comprises providing information about the charges stored in selected ones, and fewer than all, of the storage cells to the component external to the integrated circuit.

10. A method as defined in claim 9, further comprising receiving, from a component external to the integrated circuit, information identifying the selected ones of the storage cells.

11. A method as defined in claim 1, further comprising analyzing the provided information about the stored charges to identify at least one elemental constituent of a sample used to produce the spectrum.

12. A method as defined in claim 1, wherein the number of charge-transfer device light-sensitive pixel cells exceeds a specified number of exposed charge-transfer device light-sensitive pixel cells in such a manner as to allow for dynamically variable registration of wavelength to pixel number.

13. A method for time-integrating a spectrum, comprising:
   (a) illuminating a one-dimensional array of charge-transfer device light-sensitive pixel cells with the spectrum, such that each light-sensitive pixel cell is illuminated by a different portion of the spectrum, thereby creating electric charges in ones of the light-sensitive cells;
   (b) periodically non-destructively copying the charges in the light-sensitive cells to respective storage cells co-located with the pixel cells on an integrated circuit, wherein the non-destructive copying is performed without moving the charges in the light-sensitive cells to another site; and
   (c) if charges in at least one of the storage cells exceed a predetermined value, storing information about the charges in a memory.

14. A method as defined in claim 13, further comprising a step of providing the one-dimensional array of charge-transfer device light-sensitive pixel cells.

15. A method as defined in claim 13, wherein the memory is co-located with the pixel cells on the integrated circuit.

16. A method as defined in claim 13, further comprising clearing charges in at least one light-sensitive pixel cell corresponding to the at least one storage cell.

17. A method as defined in claim 13, further comprising, if an exposure time exceeds a predetermined value, storing information about the charges in a memory.

18. A method as defined in claim 13, further comprising, if charges in at least one of the storage cells exceed a predetermined value, clearing charges in at least one light-sensitive pixel cell corresponding to the at least one storage cell.

19. A method as defined in claim 13, wherein storing the information in the memory comprises storing a timestamp associated with the stored information.

20. A method as defined in claim 13, further comprising summing, on a per-pixel basis, the information stored in the memory.

21. A method as defined in claim 13, further comprising, if a predetermined amount of time passes, storing information about charges in at least one of the storage cells in a memory without clearing charges in at least one corresponding light-sensitive pixel cell.

22. An integrated circuit, comprising:
   an array of charge-transfer device light-sensitive pixel cells;
   a plurality of sets of charge storage cells, wherein, for each set of the storage cells, each storage cell of the set is coupled to a different one of the light-sensitive pixel cells for copying a charge from the light-sensitive pixel cell to the storage cell;
   first control logic operative to periodically non-destructively copy photogenerated charges from the pixel cells to a successive set of the storage cells, wherein the non-destructive copying is performed without moving the charges in the light-sensitive cells to another site; and
   second control logic operative to provide information about the charges stored in at least one of the storage cells to a component external to the integrated circuit.

23. An integrated circuit as defined in claim 22, further comprising a plurality of preamplifiers, a preamplifier associated with each light-sensitive pixel cell.

24. An integrated circuit as defined in claim 22, wherein the array of light-sensitive pixel cells is a one-dimensional array.

25. An integrated circuit as defined in claim 22, wherein the array of pixel cells is a two-dimensional array.

26. An integrated circuit as defined in claim 22, wherein the array of light-sensitive pixel cells comprises at least 2,000 pixels arranged in a one-dimensional array.

27. An integrated circuit as defined in claim 22, wherein the plurality of sets of charge storage cells comprises at least 16 sets of storage cells.

28. An integrated circuit as defined in claim 22, wherein the second control logic is operative to provide the information about the charges stored in fewer than all of the storage cells to the component external to the integrated circuit.

29. An integrated circuit as defined in claim 22, wherein the information about the charges stored in the storage cells is randomly addressable by a component external to the integrated circuit.

30. An integrated circuit as defined in claim 22, further comprising third control logic operative to receive information identifying fewer than all of the pixel cells and to clear the photogenerated charges stored in the identified pixel cells.

31. An integrated circuit as defined in claim 22, wherein each set of storage cells comprises at least as many storage cells as pixel cells in the array.

32. An integrated circuit as defined in claim 22, wherein the second control logic is operative to provide the information about the charges stored in the at least one of the storage cells to the external component as an analog signal.

33. An integrated circuit as defined in claim 22, further comprising:
   at least one analog-to-digital converter coupled to the storage cells;
   wherein the second control logic is operative to provide the information about the charges stored in the at least one of the storage cells to the external component as a digital signal.

34. An integrated circuit, comprising:
   a one-dimensional array of charge-transfer device light-sensitive pixel cells;
   a set of charge storage cells, each storage cell of the set being coupled to a different one of the pixel cells for copying a charge from the pixel cell to the storage cell;
   first control logic operative to non-destructively copy photogenerated charges from at least some of the pixel cells to the set of the storage cells, wherein the non-destructive copying is performed without moving the charges in the light-sensitive cells to another site; and
   second control logic operative to provide information about the charges stored in at least some of the storage cells to a component external to the integrated circuit.

* * * * *